US012051688B2

(12) United States Patent
Tsutsumida et al.

(10) Patent No.: US 12,051,688 B2
(45) Date of Patent: Jul. 30, 2024

(54) MANUFACTURING METHOD AND SEMICONDUCTOR DEVICE

(71) Applicant: Nuvoton Technology Corporation Japan, Kyoto (JP)

(72) Inventors: Kazumi Tsutsumida, Toyama (JP); Katsuyoshi Jokyu, Niigata (JP); Keiichi Murayama, Toyama (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 0 days.

(21) Appl. No.: 18/261,796

(22) PCT Filed: Sep. 27, 2022

(86) PCT No.: PCT/JP2022/035855
§ 371 (c)(1),
(2) Date: Jul. 17, 2023

(87) PCT Pub. No.: WO2023/181460
PCT Pub. Date: Sep. 28, 2023

(65) Prior Publication Data
US 2024/0038758 A1 Feb. 1, 2024

Related U.S. Application Data

(60) Provisional application No. 63/322,437, filed on Mar. 22, 2022.

(51) Int. Cl.
*H01L 27/02* (2006.01)
*H01L 29/06* (2006.01)
(Continued)

(52) U.S. Cl.
CPC ...... *H01L 27/0255* (2013.01); *H01L 29/0692* (2013.01); *H01L 29/7808* (2013.01); *H01L 29/866* (2013.01)

(58) Field of Classification Search
CPC ............ H01L 27/0255; H01L 27/0251; H01L 27/0203; H01L 27/0218; H01L 27/04;
(Continued)

(56) References Cited

U.S. PATENT DOCUMENTS

2008/0079081 A1   4/2008   Hashimoto
2012/0326207 A1*  12/2012  Yoshimochi ........ H01L 29/0653
                                              257/E29.198
(Continued)

FOREIGN PATENT DOCUMENTS

CN    108389858 A    8/2018
JP    2008-085278 A  4/2008
(Continued)

OTHER PUBLICATIONS

International Search Report dated Dec. 20, 2022 issued in International Patent Application No. PCT/JP2022/035855.
(Continued)

*Primary Examiner* — Natalia A Gondarenko
(74) *Attorney, Agent, or Firm* — Rimon P.C.

(57) ABSTRACT

A semiconductor device manufacturing method includes: forming a first groove having depth H in a semiconductor layer; filling the first groove with an oxide film and forming a surface oxide film having thickness a on an upper surface of the semiconductor layer to equalize the oxide film and the surface oxide film in height; forming a second groove having depth h greater than thickness a, from an uppermost surface of a third oxide film; forming gate trenches deeper than depth H, in the semiconductor layer; depositing polysilicon until at least the gate trenches and the second groove are filled with polysilicon; forming a peripheral element by injecting an impurity into polysilicon deposited in the second groove; and making a thickness of the peripheral element equal to depth h by concurrently removing poly-
(Continued)

silicon deposited in the gate trenches and polysilicon deposited in the second groove until they become equal in height.

6 Claims, 29 Drawing Sheets

(51) Int. Cl.
  *H01L 29/78* (2006.01)
  *H01L 29/866* (2006.01)
(58) Field of Classification Search
  CPC ............ H01L 27/0705; H01L 27/13; H01L 29/0692; H01L 29/0696; H01L 29/4236; H01L 29/42352; H01L 29/66325; H01L 29/66333–66348; H01L 29/66848; H01L 29/77375; H01L 29/397; H01L 29/7808; H01L 29/7832; H01L 29/78645; H01L 29/7889; H01L 29/7926; H01L 29/78642; H01L 21/822; H01L 21/76898; H01L 21/76877; H01L 21/76834; H01L 29/7825; H01L 29/7813; H01L 29/7788; H01L 29/866; H01L 29/66613–66628; H01L 21/308–3088; H01L 21/823418; H01L 21/823425; H01L 21/823814
  USPC ......... 257/296, 139, 330, E29.198, E21.384; 438/138, 270, 586
  See application file for complete search history.

(56) References Cited

U.S. PATENT DOCUMENTS

| | | |
|---|---|---|
| 2013/0075810 A1 | 3/2013 | Hsieh |
| 2013/0221428 A1* | 8/2013 | Venkatraman ...... H01L 29/7811 |
| | | 438/270 |
| 2015/0295071 A1 | 10/2015 | Hikasa |
| 2017/0256536 A1 | 9/2017 | Nishida et al. |
| 2018/0277641 A1* | 9/2018 | Karmous ............ H01L 29/0615 |
| 2019/0319126 A1 | 10/2019 | Matsushima et al. |
| 2019/0393333 A1* | 12/2019 | Fujita ................ H01L 21/02118 |
| 2020/0135713 A1 | 4/2020 | Lin et al. |
| 2021/0111276 A1* | 4/2021 | Karmous ............ H01L 29/7396 |

FOREIGN PATENT DOCUMENTS

| | | |
|---|---|---|
| JP | 2016-178197 A | 10/2016 |
| JP | 2018-098476 A | 6/2018 |
| JP | 6566512 B2 | 8/2019 |
| WO | 2018/123799 A1 | 7/2018 |

OTHER PUBLICATIONS

Written Opinion of the International Searching Authority dated Dec. 20, 2022 issued in International Patent Application No. PCT/JP2022/035855, with English translation.

* cited by examiner

MANUFACTURING METHOD AND SEMICONDUCTOR DEVICE

CROSS-REFERENCE OF RELATED APPLICATIONS

This application is the U.S. National Phase under 35 U.S.C. § 371 of International Patent Application No. PCT/JP2022/035855, filed on Sep. 27, 2022, which in turn claims the benefit of U.S. Provisional Patent Application No. 63/322,437, filed on Mar. 22, 2022, the entire disclosures of which applications are incorporated by reference herein.

TECHNICAL FIELD

The present disclosure relates to a method for manufacturing a semiconductor device, and a semiconductor device.

BACKGROUND ART

Semiconductor devices that include a vertical metal oxide semiconductor (MOS) transistor and a peripheral element and a manufacturing method of the semiconductor devices are conventionally known.

Here, the peripheral element is, for example, a resistor element, a Zener diode, and so on formed for protecting the semiconductor device from surge current.

CITATION LIST

Patent Literature

[PTL 1] Japanese Unexamined Patent Application Publication No. 2008-85278

SUMMARY OF INVENTION

Technical Problem

Regarding the semiconductor devices including a vertical MOS transistor and a peripheral element, there is a demand for reduction of resistance of the vertical MOS transistor in a current path of principal current that flows when the vertical MOS transistor is in a conducting state (hereinafter also referred to as "on-resistance").

In view of the above, an object of the present disclosure is to provide a manufacturing method for manufacturing a semiconductor device that includes a vertical MOS transistor with reduced on-resistance and a peripheral element, and a semiconductor device having a structure suitable for including a vertical MOS transistor with reduced on-resistance and a peripheral element.

Solution to Problem

A manufacturing method according to an aspect of the present disclosure is a manufacturing method for manufacturing a semiconductor device that is a face-down mountable, chip-size-package type semiconductor device, the semiconductor device including: a semiconductor layer of a first conductivity type; a vertical metal oxide semiconductor (MOS) transistor that is at least partially provided inside the semiconductor layer and includes, in a central region including an active region where a channel is provided, a plurality of gate trenches extending in a first direction in plan view of the semiconductor layer; and a peripheral element that is provided inside the semiconductor layer, is made of polysilicon, and is at least partially provided in a peripheral region adjacent to and surrounding the central region in plan view of the semiconductor layer, the manufacturing method including, in stated order: a first process of forming a first groove having a depth H from an upper surface of the semiconductor layer, in the semiconductor layer in a first range that at least partially includes the peripheral region in plan view of the semiconductor layer; a second process of depositing a first oxide film up to at least the upper surface of the semiconductor layer to fill the first groove, and concurrently forming a second oxide film of a thickness a on the upper surface of the semiconductor layer and a third oxide film on an upper surface of the first oxide film to make an uppermost surface of the second oxide film formed on the upper surface of the semiconductor layer and an uppermost surface of the third oxide film formed on the upper surface of the first oxide film flush with each other; a third process of forming a second groove having depth h from the uppermost surface of the third oxide film, in the third oxide film and the first oxide film in a second range that is included in the first range and at least partially includes the peripheral region in plan view of the semiconductor layer, the depth h being greater than the thickness a; a fourth process of forming the plurality of gate trenches each having a depth from the uppermost surface of the second oxide film, in the semiconductor layer in the central region, the depth being greater than the depth H; a fifth process of depositing polysilicon on an upper surface side of the semiconductor layer until at least the plurality of gate trenches and the second groove are filled with the polysilicon; a sixth process of forming the peripheral element by injecting an impurity into the polysilicon deposited in the second groove; and a seventh process of making a thickness of the peripheral element equal to the depth h by concurrently removing the polysilicon deposited in the plurality of gate trenches and the polysilicon deposited in the second groove by chemical mechanical polishing until the uppermost surface of the second oxide film, an upper surface of the polysilicon deposited in the plurality of gate trenches, and an upper surface of the polysilicon deposited in the second groove become flush with each other.

A semiconductor device according to an aspect of the present disclosure is a semiconductor device that is a face-down mountable, chip-size-package type semiconductor device, the semiconductor device including: a semiconductor layer of a first conductivity type; a vertical metal oxide semiconductor (MOS) transistor that is at least partially provided inside the semiconductor layer and includes, in a central region including an active region where a channel is provided, a plurality of gate trenches extending in a first direction in plan view of the semiconductor layer; and a peripheral element that is provided inside the semiconductor layer, is made of polysilicon, and is at least partially provided in a peripheral region adjacent to and surrounding the central region in plan view of the semiconductor layer, wherein the peripheral element is provided inside a first groove having a depth smaller than a depth of the plurality of gate trenches, the first groove being provided in the semiconductor layer in a first range that at least partially includes the peripheral region in plan view of the semiconductor layer, and an upper surface of the peripheral element and an uppermost surface of a surface oxide film provided in contact with an upper surface of the semiconductor layer are flush with each other.

Advantageous Effects of Invention

According to an aspect of the present disclosure, a manufacturing method for manufacturing a semiconductor device that includes a vertical MOS transistor with reduced on-resistance and a peripheral element is provided. Also, according to an aspect of the present disclosure, a semiconductor device having a structure suitable for including a vertical MOS transistor with reduced on-resistance and a peripheral element is provided.

DESCRIPTION OF EMBODIMENTS (Circumstances Leading to the Present Disclosure)

As described above, there is a demand for reduction of the on-resistance of a semiconductor device that includes a vertical MOS transistor and a peripheral element.

Thus, the inventors have diligently examined and experimented with a manufacturing method for manufacturing a semiconductor device that includes a vertical MOS transistor with reduced on-resistance and peripheral elements.

Figure 33:
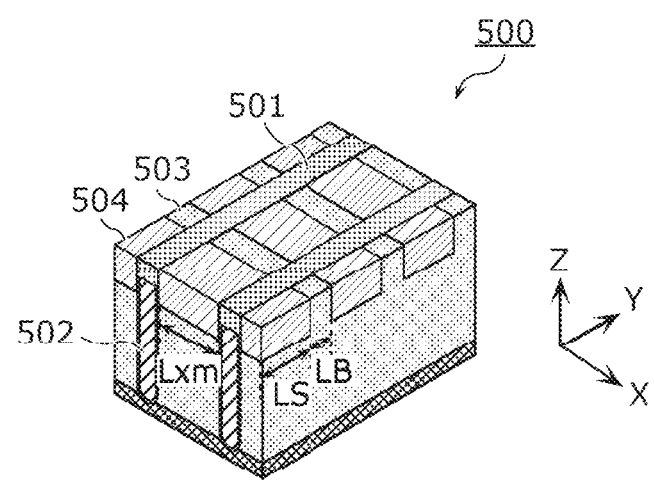
FIG. 33 is an enlarged cross-sectional perspective view illustrating the structure in the vicinity of gate trenches in a vertical MOS transistor.

FIG. 33 is an enlarged cross-sectional perspective view illustrating the structure in the vicinity of gate trenches 501 in vertical MOS transistor 500 including a plurality of gate trenches 501.

In FIG. 33, the Y-axis direction is the extending direction of gate trenches 501, the Z-axis direction is the direction opposite the depth direction of gate trenches 501, and the X-axis direction is the direction orthogonal to the Y-axis direction and the Z-axis direction and is the direction in which a plurality of gate trenches 501 are periodically arranged in stripes.

As illustrated in FIG. 33, in vertical MOS transistor 500, polysilicon 502 extending in the extending direction of gate trenches 501 is formed inside gate trenches 501, and on the upper side of body region 503 in the Z-axis direction, a plurality of source regions 504 are periodically formed in the extending direction of gate trenches 501. Polysilicon 502 inside gate trenches 501 functions as a gate conductor.

To reduce the on-resistance of vertical MOS transistor 500, the inventors considered it effective to increase the density of gate trenches 501 by narrowing mesa width Lxm, which is the width between gate trenches 501 arranged in stripes.

However, the inventors have realized a phenomenon that narrowing mesa width Lxm causes a decrease in the breakdown voltage at turn-off of vertical MOS transistor 500. By examination and experimentation, the inventors have uncovered the mechanism of the phenomenon of the decrease in the breakdown voltage at turn-off of vertical MOS transistor 500.

Vertical MOS transistor 500 structurally includes a parasitic bipolar transistor. When the semiconductor device that is being driven and including vertical MOS transistor 500 is turned off (when transitioned from a conducting state (hereinafter also referred to as an "ON state") to a non-conducting state (hereinafter also referred to as an "OFF state")), the parasitic bipolar transistor turns on easily (easily enters the ON state), and turns on more easily when the drive voltage applied until right before the semiconductor device is turned off (the semiconductor device is placed in the OFF state) is larger.

In the present disclosure, the largest one of the drive voltages that do not turn on the parasitic bipolar transistor when the semiconductor device including vertical MOS transistor 500 is turned off is referred to as a breakdown voltage at turn-off.

For example, in the case where the parasitic bipolar transistor does not turn on when the semiconductor device is turned off with a drive voltage of 10 V but the parasitic bipolar transistor turns on when the semiconductor device is turned off with a drive voltage of 11 V, then the breakdown voltage at turn-off of the semiconductor device is 10 V or greater and less than 11 V.

Note that the drive voltage is a source-source voltage (VSS) when the semiconductor device includes N conductivity type vertical MOS transistors in dual configuration, whereas the drive voltage is a drain-source voltage (VDS) when the semiconductor device includes a vertical MOS transistor in single configuration.

Here, driving refers to a state in which a voltage is applied to a gate conductor and current thereby flows between the sources (or between the drain and source). Unless otherwise noted, driving refers to causing current to flow under linear region conditions.

The inventors have found that, since narrowing mesa width Lxm eases the condition under which the parasitic bipolar transistor becomes the ON state, the parasitic bipolar transistor enters the ON state at the timing when vertical MOS transistor 500 is switched from the ON state to the OFF state, and as a result, large current flows into the ON-state parasitic bipolar transistor, which causes a breakdown of vertical MOS transistor 500.

Figure 34:
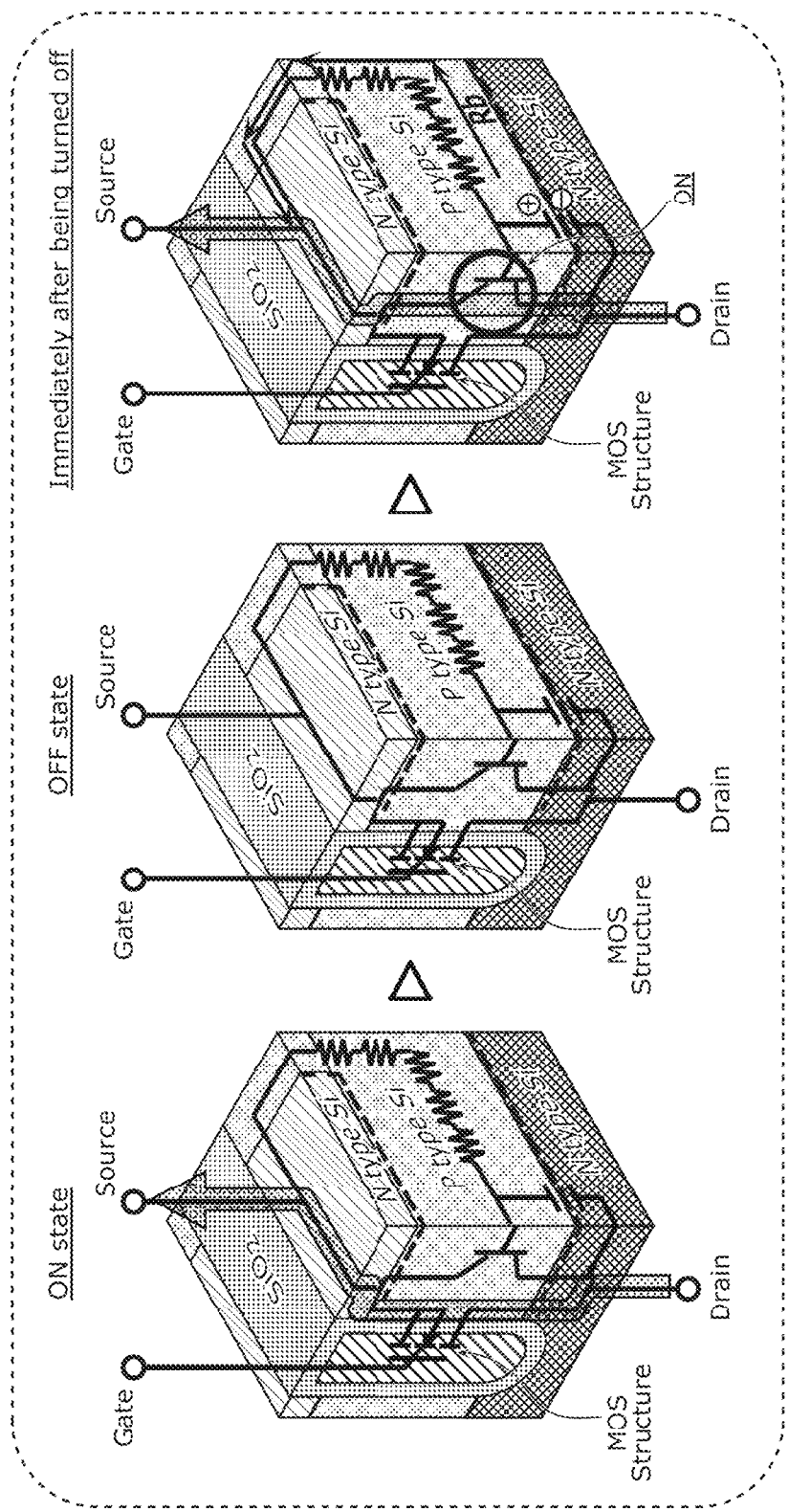
FIG. 34 is a schematic diagram for describing the mechanism of a vertical MOS transistor breakdown phenomenon.

FIG. 34 is a schematic diagram for describing the mechanism of a vertical MOS transistor 500 breakdown phenomenon.

When internal resistance Rb of body region 503 becomes larger as a result of mesa width Lxm being narrowed, voltage VBE between the base and emitter of the parasitic bipolar transistor immediately after vertical MOS transistor 500 is switched from the ON state to the OFF state becomes larger as illustrated in FIG. 34, that is, the product of Ioff×Rb of vertical MOS transistor 500 immediately after vertical MOS transistor 500 is switched from the ON state to the OFF state exceeds the forward barrier of the PN junction of 0.6 V-0.7 V, where Ioff is current that flows when the carriers accumulated due to the parasitic capacitance between the drain and source move from body region 503 to the source electrode via the region immediately below source regions 504 and Rb is the internal resistance of body region 503. As a result, the parasitic bipolar transistor enters a conducting state and large current flows into the parasitic bipolar transistor, causing a breakdown of vertical MOS transistor 500.

The inventors further examined and experimented on the basis of this finding, and found that to reduce internal resistance Rb of body region 503, it is effective to narrow width LS of source regions 504 in the extending direction of gate trenches 501 (see FIG. 33).

The inventors then found that to realize vertical MOS transistor 500 with the breakdown voltage at turn-off at a maximum drain-source specification voltage of 22 V, width LS is desirably 0.35 [μm] or less when mesa width Lxm is 0.10 [μm].

When the distance between source regions 504 in the extending direction of gate trenches 501, that is, the width of body region 503 in the extending direction of gate trenches 501, is width LB (see FIG. 33), source regions 504 each having width LS and body region 503 having width LB are generally formed by the following procedure.

First, (1) body region 503 is formed by injecting a dopant of a specific conductivity type (for example, p-type) into a semiconductor layer, then (2) a patterned resist is formed on the upper surface of the semiconductor layer to cover only a portion of body region 503 corresponding to width LB, and then (3) source regions 504 are formed by injecting a dopant of a conductivity type different from the above-mentioned specific conductivity type (for example, n-type) into openings of the patterned resist, thereby forming source regions 504 having width LS and body region 503 having width LB.

In general, the aspect ratio of the remaining width of the patterned resist to the thickness thereof has an upper limit of approximately 3.0. Further, if there is a level difference in a resist application region where a resist is applied, the resist generally requires a resist thickness greater than the level difference.

In contrast, the conventional method for manufacturing a semiconductor device that includes a vertical MOS transistor and a peripheral element, it is necessary to apply a resist of a certain thickness or greater since, in the resist application region mentioned above, a level difference is generated between the region where the vertical MOS transistor is formed and the region where the peripheral element is formed. This puts a limit to making the remaining width fine while maintaining the aspect ratio at 3.0.

Based on the above, the inventors considered that a semiconductor device which includes a vertical MOS transistor with reduced on-resistance and a peripheral element can be realized if it is possible to realize a method for manufacturing a semiconductor device which includes a vertical MOS transistor and a peripheral element and in which the above-mentioned level difference is not generated in the resist application region.

The inventors further examined and experimented based on this idea, and reached a manufacturing method according to an aspect of the present disclosure described below and a semiconductor device according to an aspect of the present disclosure described below.

A manufacturing method according to an aspect of the present disclosure is a manufacturing method for manufacturing a semiconductor device that is a face-down mountable, chip-size-package type semiconductor device, the semiconductor device including: a semiconductor layer of a first conductivity type; a vertical metal oxide semiconductor (MOS) transistor that is at least partially provided inside the semiconductor layer and includes, in a central region including an active region where a channel is provided, a plurality of gate trenches extending in a first direction in plan view of the semiconductor layer; and a peripheral element that is provided inside the semiconductor layer, is made of polysilicon, and is at least partially provided in a peripheral region adjacent to and surrounding the central region in plan view of the semiconductor layer, the manufacturing method including, in stated order: a first process of forming a first groove having a depth H from an upper surface of the semiconductor layer, in the semiconductor layer in a first range that at least partially includes the peripheral region in plan view of the semiconductor layer; a second process of depositing a first oxide film up to at least the upper surface of the semiconductor layer to fill the first groove, and concurrently forming a second oxide film of a thickness a on the upper surface of the semiconductor layer and a third oxide film on an upper surface of the first oxide film to make an uppermost surface of the second oxide film formed on the upper surface of the semiconductor layer and an uppermost surface of the third oxide film formed on the upper surface of the first oxide film flush with each other; a third process of forming a second groove having depth h from the uppermost surface of the third oxide film, in the third oxide film and the first oxide film in a second range that is included in the first range and at least partially includes the peripheral region in plan view of the semiconductor layer, the depth h being greater than the thickness a; a fourth process of forming the plurality of gate trenches each having a depth from the uppermost surface of the second oxide film, in the semiconductor layer in the central region, the depth being greater than the depth H; a fifth process of depositing polysilicon on an upper surface side of the semiconductor layer until at least the plurality of gate trenches and the second groove are filled with the polysilicon; a sixth process of forming the peripheral element by injecting an impurity into the polysilicon deposited in the second groove; and a seventh process of making a thickness of the peripheral element equal to the depth h by concurrently removing the polysilicon deposited in the plurality of gate trenches and the polysilicon deposited in the second groove by chemical mechanical polishing until the uppermost surface of the second oxide film, an upper surface of the polysilicon deposited in the plurality of gate trenches, and an upper surface of the polysilicon deposited in the second groove become flush with each other.

With the manufacturing method described above, when the seventh process ends, the uppermost surface of the second oxide film, the uppermost surface of the third oxide film, the upper surface of the polysilicon with which the plurality of gate trenches have been filled, and the upper surface of the polysilicon with which the second groove has been filled are flush with each other. That is to say, after the seventh process, there is no level difference in the region where a resist is applied for the formation of source regions having width LS.

Therefore, it is possible to inhibit an increase in the thickness of the resist taking into account the level difference. With this, width LS of the source regions formed using the resist can be narrower than in the conventional semiconductor device.

Accordingly, with the manufacturing method described above, it is possible to manufacture a semiconductor device including a vertical MOS transistor with reduced on-resistance and a peripheral element.

The manufacturing method may further include: an eighth process of forming, before the fourth process starts, a body region of the vertical MOS transistor by injecting an impurity of a second conductivity type different from the first conductivity type to an upper surface side of the semiconductor layer; and a ninth process of forming a plurality of source regions of the vertical MOS transistor after the seventh process ends, by (i) forming, on the upper surface side of the semiconductor layer, a resist including a plurality of first openings periodically formed in the first direction in plan view of the semiconductor layer, and (ii) injecting an impurity of the first conductivity type into each portion of the semiconductor layer located in the plurality of first openings in plan view of the semiconductor layer.

This way, the body region can be formed through the eighth process, and the source regions can be formed through the ninth process.

In the ninth process, the resist may be formed to have a distance of 0.30 μm or less between the plurality of first openings periodically formed, and a thickness of the resist may be adjusted to 900 nm or less.

This way, width LB of the body region can be 0.30 μm or less, and it is therefore possible to inhibit an increase in the on-resistance caused by finer width LS of the source regions.

In the fourth process, the plurality of gate trenches may be formed to cause a shortest distance between the peripheral element and a gate trench among the plurality of gate trenches which is located closest to the peripheral element in plan view of the semiconductor layer to be less than 3 μm.

With the manufacturing method described above, the factor that limits the size of the active region of the vertical MOS transistor is reduced. Accordingly, the on-resistance of the vertical MOS transistor can be further reduced.

The manufacturing method may further include: a tenth process of periodically forming, in the second oxide film, a plurality of second openings in a second direction orthogonal to the first direction in plan view of the semiconductor layer to give the second oxide film unopened portions each having a width in the second direction less than or equal to half a width of opened portions defined by the plurality of second openings, the tenth process being performed in a time period after the second process ends and before the fourth process starts, wherein, in the fourth process, the plurality of gate trenches may be formed using, as a mask pattern, the second oxide film having the plurality of second openings periodically formed, and in the ninth process, the resist may be formed to cause opened portions defined by the plurality of first openings formed periodically to have a width of 0.35 μm or less in the first direction.

This way, mesa width L×m can be less than or equal to half the width of the gate trenches, and width LS of the source regions can be 0.35 μm or less.

The manufacturing method may further include: an eleventh process of forming, after the ninth process ends, a plurality of recesses corresponding one-to-one with the plurality of gate trenches to expose a side wall inside each of the plurality of gate trenches, by etching each polysilicon deposited in the plurality of gate trenches.

With the manufacturing method described above, a source electrode made of metal and electrically connected to the source regions can be formed until a portion in each gate trench where the side wall inside the gate trench is exposed. Accordingly, the contact resistance between the source regions and the source electrode and between the body region and the source electrode can be reduced.

A semiconductor device according to an aspect of the present disclosure is a semiconductor device that is a face-down mountable, chip-size-package type semiconductor device, the semiconductor device including: a semiconductor layer of a first conductivity type; a vertical metal oxide semiconductor (MOS) transistor that is at least partially provided inside the semiconductor layer and includes, in a central region including an active region where a channel is provided, a plurality of gate trenches extending in a first direction in plan view of the semiconductor layer; and a peripheral element that is provided inside the semiconductor layer, is made of polysilicon, and is at least partially provided in a peripheral region adjacent to and surrounding the central region in plan view of the semiconductor layer, wherein the peripheral element is provided inside a first groove having a depth smaller than a depth of the plurality of gate trenches, the first groove being provided in the semiconductor layer in a first range that at least partially includes the peripheral region in plan view of the semiconductor layer, and an upper surface of the peripheral element and an uppermost surface of a surface oxide film provided in contact with an upper surface of the semiconductor layer are flush with each other.

With the semiconductor device having the above configuration, the upper surface of the peripheral element and the uppermost surface of the second oxide film are flush with each other. That is to say, there is no level difference in the region where a resist is applied for the formation of source regions having width LS.

Therefore, it is possible to inhibit an increase in the thickness of the resist taking into account the level difference. With this, width LS of each source region formed using the resist can be narrower than in the conventional semiconductor device.

Accordingly, with the semiconductor device described above, a semiconductor device having a structure suitable for including a vertical MOS transistor with reduced on-resistance and a peripheral element is provided.

The vertical MOS transistor may further include: a body region of a second conductivity type different from the first conductivity type, the body region being provided on an upper surface side of the semiconductor layer; and a plurality of source regions periodically provided in the body region in the first direction in plan view of the semiconductor layer, and a distance between the plurality of source regions periodically provided may be 0.30 μm or less.

With this, width LB of the body region can be 0.30 μm or less.

A shortest distance between the peripheral element and a gate trench among the plurality of gate trenches which is located closest to the peripheral element in plan view of the semiconductor layer may be less than 3 μm.

With the semiconductor device having the above configuration, the factor that limits the size of the active region of the vertical MOS transistor is reduced. Accordingly, the on-resistance of the vertical MOS transistor can be further reduced.

The plurality of gate trenches may be periodically provided in stripes in a second direction orthogonal to the first direction in plan view of the semiconductor layer, and a distance between the plurality of gate trenches in the second direction may be less than or equal to half a width of the plurality of gate trenches in the second direction, and a width, in the first direction, of each of the plurality of source regions periodically provided may be 0.35 μm or less.

With this, mesa width L×m can be less than or equal to half the width of the gate trenches, and width LS of each source region can be 0.35 μm or less.

When: a third direction is a direction in which, in plan view of the semiconductor layer, a distance between the peripheral element and a gate trench among the plurality of gate trenches which is located closest to the peripheral element is shortest; L denotes a width of the first groove in the third direction; b denotes a distance between a lowest position of the peripheral element and a bottom surface of the first groove; and I denotes a width of the peripheral element in the third direction, L, b, and I may satisfy I≤L−2b, and a distance between a side wall of the first groove and the peripheral element may be b or greater.

With the semiconductor device having the above configuration, the distance between the peripheral element and the semiconductor layer becomes b or greater in all directions. Therefore, a given insulating property determined by b is ensured between the peripheral element and the semiconductor layer.

The vertical MOS transistor may further include: inside each of the plurality of gate trenches, polysilicon extending in the first direction from one end to an other end of the gate trench; a plurality of first connection regions and a plurality of second connection regions that are trenches each including, inside the trench, polysilicon connecting each of at least two polysilicon included inside at least two adjacent gate trenches among the plurality of gate trenches, the plurality of first connection regions extending over one ends of the at least two adjacent gate trenches in the first direction, the plurality of second connection regions extending over other ends of the at least two adjacent gate trenches in the first direction; and a gate electrode and gate wiring, the gate electrode being made of metal and being an electrode for applying a voltage to the each polysilicon included inside each of the plurality of gate trenches, the gate wiring being electrically connected to the gate electrode, connecting to, at each of a plurality of first contact surfaces, the each polysilicon included in each of the plurality of first connection regions, and connecting to, at each of a plurality of second contact surfaces, the each polysilicon included in each of the plurality of second connection regions, and each of the plurality of first contact surfaces and each of the plurality of second contact surfaces may be flush with the uppermost surface of the surface oxide film.

With this, the contact resistance between the gate electrode and the polysilicon inside each of the plurality of gate trenches can be reduced.

In plan view of the semiconductor layer, each of the plurality of first connection regions may be in a shape in which a length of a shortest line segment inside the first connection region is less than twice a depth of the first connection region from the uppermost surface of the surface oxide film, and in plan view of the semiconductor layer, each of the plurality of second connection regions may be in a shape in which a length of a shortest line segment inside the second connection region is less than twice a depth of the second connection region.

In the process of depositing polysilicon, polysilicon generally grows isotropically. Thus, when filling the inside of the groove with polysilicon, polysilicon grows from the bottom surface of the groove and the side surface of the groove at the same time. Therefore, when the groove is relatively deep and its surface area in plan view is relatively large, it is generally difficult to fill the groove with polysilicon. In the semiconductor device having the above configuration, the first connection regions and the second connection regions may apply to this.

On the other hand, it is generally known that the inside of a groove can be filled with polysilicon relatively easily if the groove satisfies the condition that the length of the shortest line segment inside the groove in plan view is less than twice the depth of the groove, regardless of the shape of the groove in plan view.

In the semiconductor device having the above configuration, the first connection regions and the second connection regions satisfy the above condition.

Therefore, with the semiconductor device having the above configuration, the first connection regions and the second connection regions can have a structure suitable for being filled with polysilicon relatively easily.

Hereinafter, a specific example of a manufacturing method and a semiconductor device according to an aspect of the present disclosure will be described with reference to the drawings. The embodiment below illustrates a specific example of the present disclosure. Therefore, numerical values, shapes, constituent elements, the arrangement and connection of the constituent elements, steps (processes), the processing order of the steps, etc. illustrated in the embodiment below are mere examples, and do not intend to limit the present disclosure. Also, the drawings are represented schematically and are not necessarily precise illustrations. In the drawings, constituent elements that are essentially the same share the same reference signs, and duplicate descriptions will be omitted or simplified.

[Embodiment]

The following is a description of a semiconductor device according to an embodiment. This semiconductor device is a face-down mountable, chip-size-package (CSP) type semiconductor device, and includes: a vertical metal oxide semiconductor (MOS) transistor that is at least partially formed inside a semiconductor layer; and a peripheral element that is formed inside the semiconductor layer and made of polysilicon.

[1. Structure of Semiconductor Device]

Figure 1:
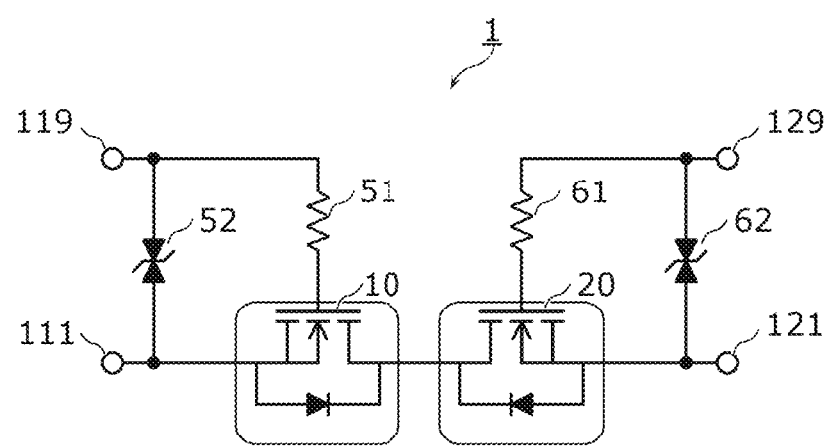
FIG. 1 is a circuit diagram illustrating an example of the circuit configuration of a semiconductor device according to an embodiment.

FIG. 1 is a circuit diagram illustrating an example of the configuration of semiconductor device 1 according to the embodiment. As illustrated in FIG. 1, semiconductor device 1 includes first vertical MOS transistor 10, first resistor element 51, first Zener diode 52, second vertical MOS transistor 20, second resistor element 61, second Zener diode 62, first source pad 111, first gate pad 119, second source pad 121, and second gate pad 129.

Here, first vertical MOS transistor 10 and second vertical MOS transistor 20 are vertical MOS transistors each of which is at least partially formed inside semiconductor layer 40 that is described later (see, for example, FIG. 2 that is described later).

First resistor element 51, first Zener diode 52, second resistor element 61, and second Zener diode 62 are protection elements formed for protecting semiconductor device 1 from surge current, and are peripheral elements that are made of polysilicon and formed inside semiconductor layer 40.

In the following description, semiconductor device 1 includes: two vertical MOS transistors, namely first vertical MOS transistor 10 and second vertical MOS transistor 20, each of which is at least partially formed inside semiconductor layer 40; and four peripheral elements, namely first resistor element 51, first Zener diode 52, second resistor element 61, and second Zener diode 62, each of which is made of polysilicon and is formed inside semiconductor layer 40. However, semiconductor device 1 need not necessarily be limited to the configuration illustrated in FIG. 1, so long as it includes: one or more vertical MOS transistors each of which is at least partially formed inside semiconductor layer 40; and one or more peripheral elements each of which is made of polysilicon and is formed inside semiconductor layer 40.

Figure 2:
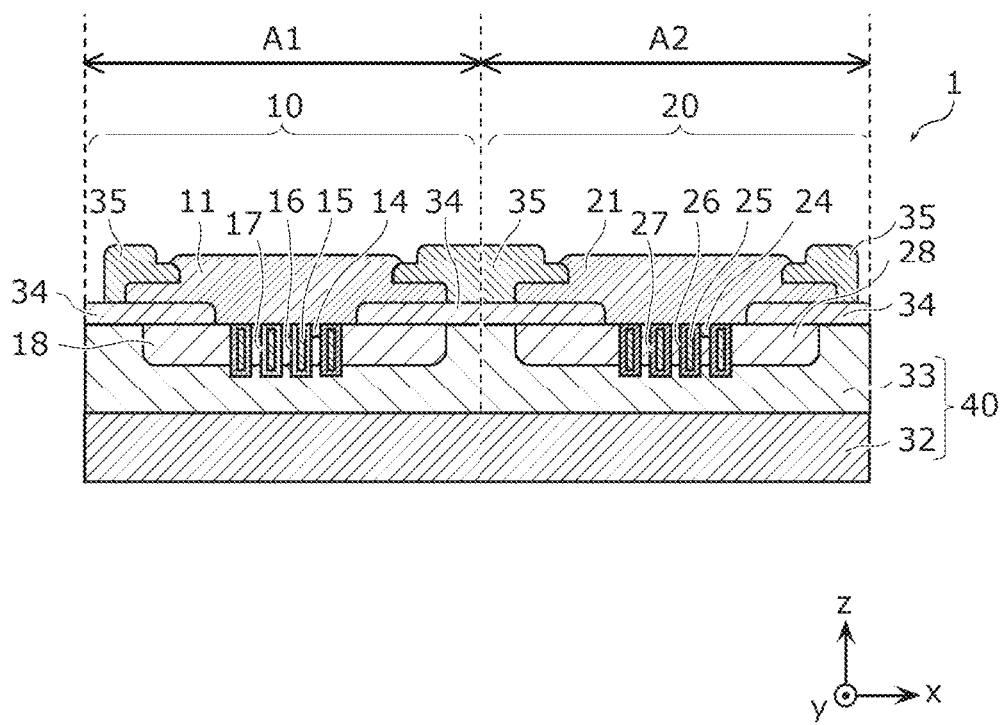
FIG. 2 is a cross-sectional view illustrating an example of the structure of the semiconductor device according to the embodiment.
Figure 3:
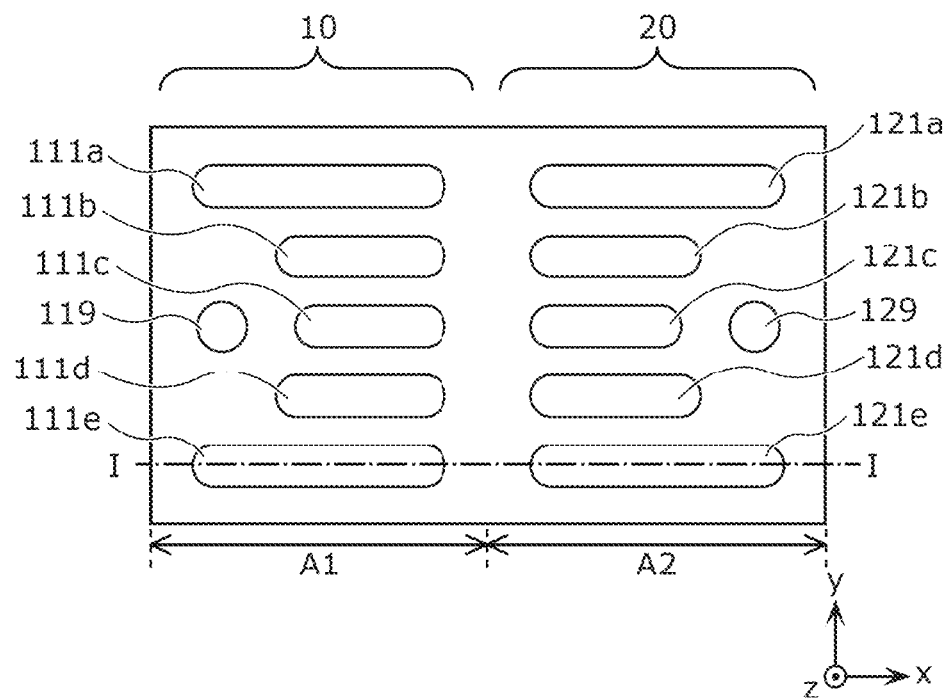
FIG. 3 is a plan view illustrating an example of the configuration of the semiconductor device according to the embodiment.

FIG. 2 is a cross-sectional view illustrating an example of the structure of semiconductor device 1. FIG. 3 is a plan view illustrating an example of the structure of semiconductor device 1. FIG. 2 illustrates a cross section taken at line I-I illustrated in FIG. 3.

As illustrated in FIG. 2 and FIG. 3, semiconductor device 1 includes semiconductor layer 40, surface oxide film 34, passivation layer 35, first vertical MOS transistor 10 that is at least partially formed in first semiconductor layer inner region A1 in semiconductor layer 40, and second vertical MOS transistor 20 that is at least partially formed in second semiconductor layer inner region A2 in semiconductor layer 40.

Note that in plan view of semiconductor layer 40, first semiconductor layer inner region A1 and second semiconductor layer inner region A2 are adjacent to each other, and divide the surface area of semiconductor layer 40 into equal halves.

Semiconductor layer 40 is formed by stacking semiconductor substrate 32 and low-concentration impurity layer 33.

Semiconductor substrate 32 is disposed on the lower surface side of semiconductor layer 40, and comprises silicon containing an impurity of a first conductivity type (for example, N-type).

Low-concentration impurity layer 33 is disposed on the upper surface side of semiconductor layer 40, is formed in contact with semiconductor substrate 32, and contains an impurity of the first conductivity type at a concentration lower than the concentration of the impurity of the first conductivity type contained in semiconductor substrate 32. Low-concentration impurity layer 33 may be formed on semiconductor substrate 32 by epitaxial growth, for example.

Surface oxide film 34 is formed in contact with the upper surface of semiconductor layer 40.

Passivation layer 35 covers at least part of the uppermost surface of surface oxide film 34.

As illustrated in FIG. 2 and FIG. 3, first vertical MOS transistor 10 includes, on the upper surface of semiconductor layer 40, one or more (in this case, five) first source pads 111 (in this case, first source pads 111a, 111b, 111c, 111d, and 111e) and one or more first gate pads 119 (in this case, one first gate pad 119) that are bonded to the mounting substrate via a bonding material during face-down mounting. Also, second vertical MOS transistor 20 includes, on the upper surface of semiconductor layer 40, one or more (in this case, five) second source pads 121 (in this case, second source pads 121a, 121b, 121c, 121d, and 121e) and one or more second gate pads 129 (in this case, one second gate pad 129) that are bonded to the mounting substrate via a bonding material during face-down mounting.

Note that each of the total number of one or more first source pads 111 and the total number of one or more second source pads 121 need not necessarily be limited to five as illustrated in FIG. 3, and may be a number greater than or equal to one and other than five.

Also, each of the total number of one or more first gate pads 119 and the total number of one or more second gate pads 129 need not necessarily be limited to one as illustrated in FIG. 3, and may be a number greater than or equal to one and other than one.

As illustrated in FIG. 2 and FIG. 3, first body region 18 containing an impurity of a second conductivity type (for example, P-type) different from the first conductivity type is formed in first semiconductor layer inner region A1 of low-concentration impurity layer 33. Formed in first body region 18 are a plurality of first source regions 14 containing an impurity of the first conductivity type and a plurality of first gate trenches 17 extending in a first direction (in this case, the Y-axis direction). Formed inside each first gate trench 17 are first gate conductor 15 extending in the extending direction of first gate trenches 17, that is, the first direction, and first gate oxide film 16 covering the side surface and the bottom surface of first gate conductor 15.

Here, first gate conductor 15 is polysilicon. Thus, first gate conductor 15 is hereinafter also referred to as polysilicon 15.

Second body region 28 containing an impurity of the second conductivity type is formed in second semiconductor layer inner region A2 of low-concentration impurity layer 33. Formed in second body region 28 are a plurality of second source regions 24 containing an impurity of the first conductivity type and a plurality of second gate trenches 27 extending in the first direction. Formed inside each second gate trench 27 are second gate conductor 25 extending in the extending direction of second gate trenches 27, that is, the first direction, and second gate oxide film 26 covering the side surface and the bottom surface of second gate conductor 25.

Here, second gate conductor 25 is polysilicon as with first gate conductor 15.

Figure 4:
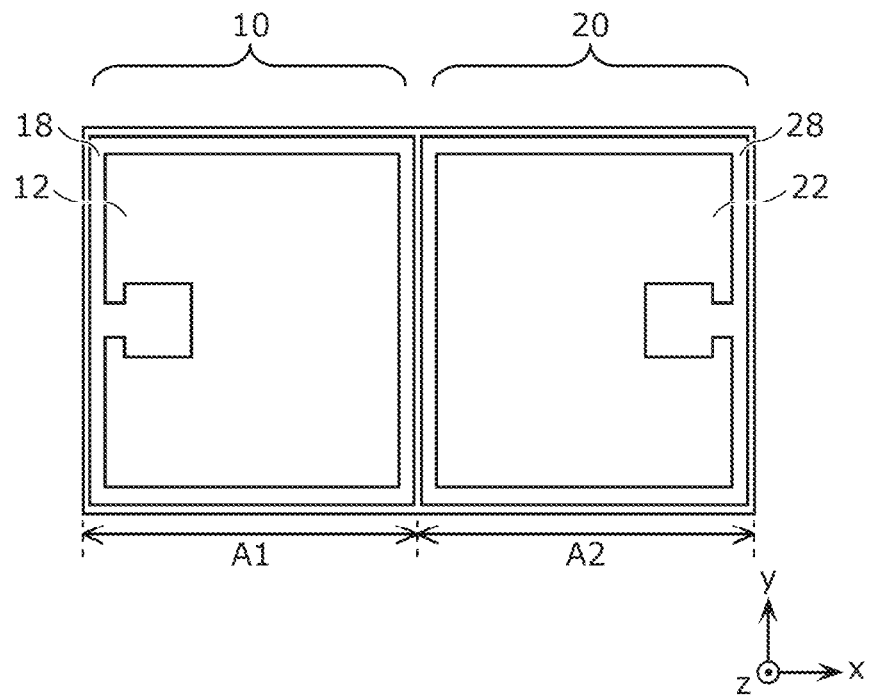
FIG. 4 is a plan view illustrating an example of the shapes of a first body region and a second body region according to the embodiment.

FIG. 4 is a plan view illustrating an example of the shapes of, among the constituent elements of semiconductor device 1, first body region 18 and second body region 28 in plan view of semiconductor layer 40.

In FIG. 4, first active region 12 is a region in first body region 18 where the plurality of first gate trenches 17 extending in the first direction are formed, and second active region 22 is a region in second body region 28 where the plurality of second gate trenches 27 extending in the first direction are formed.

Although first body region 18, second body region 28, first active region 12, and second active region 22 are actually not visible from the outside of semiconductor device 1, FIG. 4 illustrates first body region 18, second body region 28, first active region 12, and second active region 22 as though they are visible.

FIG. 4 omits illustration of the constituent elements included in semiconductor device 1, other than first body region 18, second body region 28, first active region 12, and second active region 22.

As illustrated in FIG. 4, in plan view of semiconductor layer 40, first active region 12 is included in first body region 18, and second active region 22 is included in second body region 28.

The larger the surface area of first active region 12 in plan view of semiconductor layer 40 is, the more the on-resistance of first vertical MOS transistor 10 is reduced, and the larger the surface area of second active region 22 in plan view of semiconductor layer 40 is, the more the on-resistance of second vertical MOS transistor 20 is reduced.

Referring back to FIG. 2 and FIG. 3 again, the following continues with the description of the configuration of semiconductor device 1.

The lower surface of first source electrode 11 is connected to the plurality of first source regions 14 and first body region 18. First source electrode 11 has, on the upper surface thereof, portions that are exposed to the outside. Each of the one or more first source pads 111 is each of such portions on the upper surface of first source electrode 11, portions that are exposed to the outside.

First source electrode 11 is made of a metal material including one or more of the following non-limiting examples: nickel, titanium, tungsten, palladium, aluminum, copper, gold, and silver. The upper surface of first source electrode 11 may be plated with gold, for example.

First gate electrode 19 (not illustrated in FIG. 2 or FIG. 3; see, for example, FIG. 5 that is described later) is metal for applying a voltage to each of a plurality of first gate conductors 15, and is connected to each of the plurality of first gate conductors 15 via first resistor element 51 and first gate wiring 53 that is described later (not illustrated in FIG. 2 or FIG. 3; see, for example, FIG. 7 that is described later). First gate pad 119 is such portion on the upper surface of first gate electrode 19, portion that is exposed to the outside.

First gate electrode 19 is made of a metal material including one or more of the following non-limiting examples: nickel, titanium, tungsten, palladium, aluminum, copper, gold, and silver. The upper surface of first gate electrode 19 may be plated with gold, for example.

The lower surface of second source electrode 21 is connected to the plurality of second source regions 24 and second body region 28. Second source electrode 21 has, on the upper surface thereof, portions that are exposed to the outside. Each of the one or more second source pads 121 is each of such portions on the upper surface of second source electrode 21, portions that are exposed to the outside.

Second source electrode 21 is made of a metal material including one or more of the following non-limiting examples: nickel, titanium, tungsten, palladium, aluminum, copper, gold, and silver. The upper surface of second source electrode 21 may be plated with gold, for example.

Second gate electrode 29 (not illustrated in FIG. 2 or FIG. 3; see, for example, FIG. 5 that is described later) is metal for applying a voltage to each of a plurality of second gate conductors 25, and is connected to each of the plurality of second gate conductors 25 via second resistor element 61 and second gate wiring (not illustrated). Second gate pad 129 is such portion on the upper surface of second gate electrode 29, portion that is exposed to the outside.

Second gate electrode 29 is made of a metal material including one or more of the following non-limiting examples: nickel, titanium, tungsten, palladium, aluminum, copper, gold, and silver. The upper surface of second gate electrode 29 may be plated with gold, for example.

Figure 5:
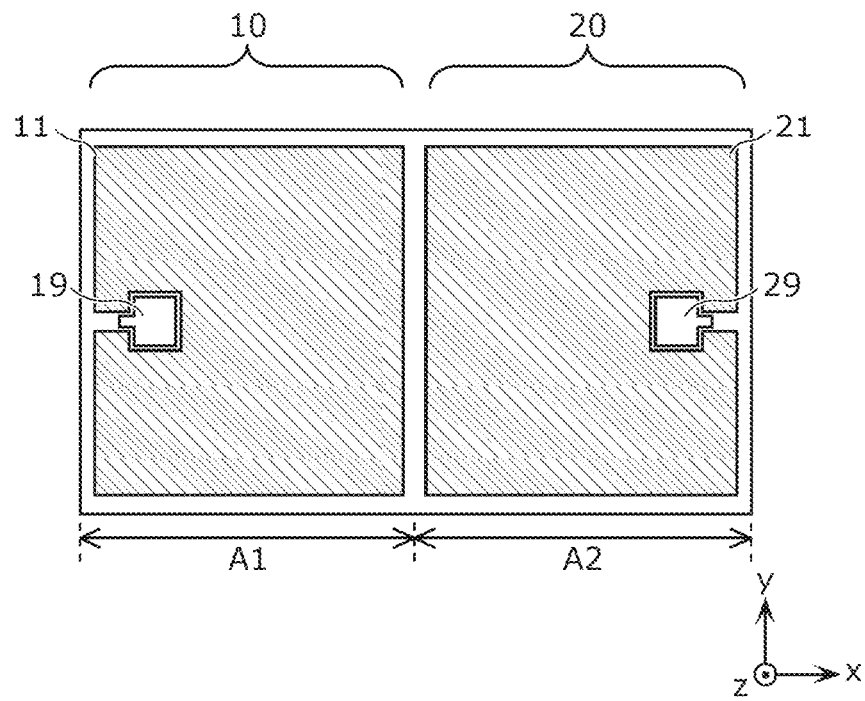
FIG. 5 is a plan view illustrating an example of the shapes of a first source electrode, a first gate electrode, a second source electrode, and a second gate electrode according to the embodiment.

FIG. 5 is a plan view illustrating an example of the shapes of, among the constituent elements of semiconductor device 1, first source electrode 11, first gate electrode 19, second source electrode 21, and second gate electrode 29 in plan view of semiconductor layer 40.

Although first source electrode 11, first gate electrode 19, second source electrode 21, and second gate electrode 29 are actually not visible from the outside of semiconductor device 1, except for first source pads 111, first gate pad 119, second source pads 121, and second gate pad 129, FIG. 5 illustrates first source electrode 11, first gate electrode 19, second source electrode 21, and second gate electrode 29 as though they are visible in their entirety.

FIG. 5 omits illustration of the constituent elements included in semiconductor device 1, other than first source electrode 11, first gate electrode 19, second source electrode 21, and second gate electrode 29.

Referring back to FIG. 2 and FIG. 3 again, the following continues with the description of the configuration of semiconductor device 1.

Since first vertical MOS transistor 10 and second vertical MOS transistor 20 have the configuration described above, low-concentration impurity layer 33 and semiconductor substrate 32 function as a common drain region that serves as both the drain region of first vertical MOS transistor 10 and the drain region of second vertical MOS transistor 20.

In first vertical MOS transistor 10, the contact surface between first body region 18 and low-concentration impurity layer 33 has a PN junction, which functions as a body diode.

Similarly, in second vertical MOS transistor 20, the contact surface between second body region 28 and low-concentration impurity layer 33 has a PN junction, which functions as a body diode.

In the present specification, a region in semiconductor layer 40 which overlaps a source electrode in plan view of semiconductor layer 40 is defined as a central region, and a region in semiconductor layer which surrounds the central region in plan view of semiconductor layer 40 is defined as a peripheral region.

According to these definitions, hereinafter, a region in semiconductor layer 40 which overlaps first source electrode 11 in plan view of semiconductor layer 40 is referred to as first central region 41, a region in semiconductor layer 40 which overlaps second source electrode 21 in plan view of semiconductor layer 40 is referred to as second central region 42, and a region in semiconductor layer that surrounds first central region 41 and second central region 42 in plan view of semiconductor layer 40 is referred to as peripheral region 43.

Figure 6:
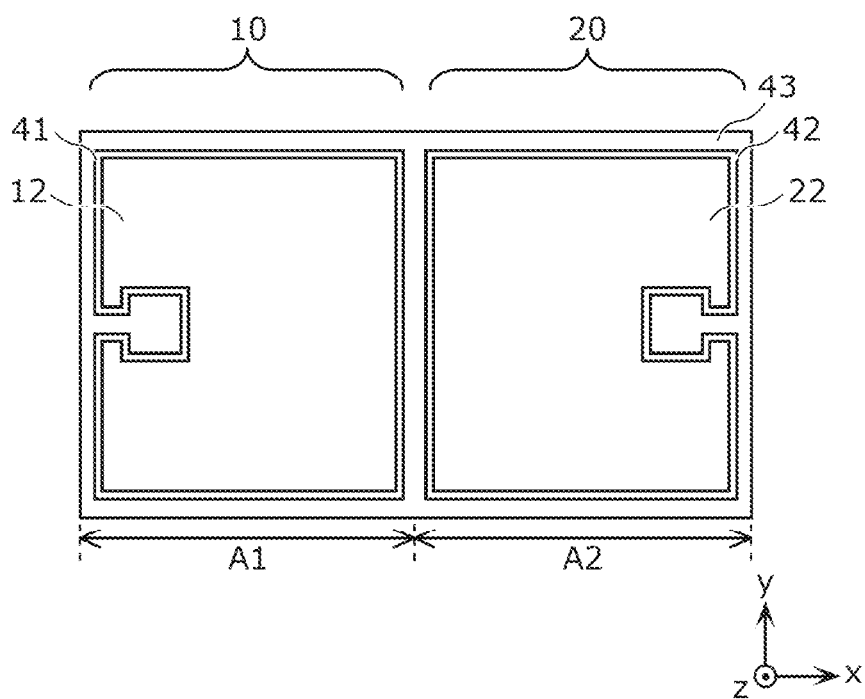
FIG. 6 is a plan view illustrating an example of the shapes of a first central region, a second central region, a peripheral region, a first active region, and a second active region according to the embodiment.

FIG. 6 is a plan view illustrating an example of the shapes of, among the constituent elements of semiconductor device 1, first central region 41, second central region 42, peripheral region 43, first active region 12, and second active region 22 in plan view of semiconductor layer 40.

Although first central region 41, second central region 42, peripheral region 43, first active region 12, and second active region 22 are actually not visible from the outside of semiconductor device 1, FIG. 6 illustrates first central region 41, second central region 42, peripheral region 43, first active region 12, and second active region 22 as though they are visible.

FIG. 6 omits illustration of the constituent elements included in semiconductor device 1, other than first central region 41, second central region 42, peripheral region 43, first active region 12, and second active region 22.

As illustrated in FIG. 6, in plan view of semiconductor layer 40, first active region 12 is included in first central region 41, and second active region 22 is included in second central region 42.

Hereinafter, the structure of semiconductor device 1 in the vicinity of first gate electrode 19 in plan view of semiconductor layer will be described with reference to the drawings. Note that the structure of semiconductor device 1 in the vicinity of second gate electrode 29 in plan view of semiconductor layer 40 is the same as the structure of semiconductor device 1 in the vicinity of first gate electrode 19 in plan view of semiconductor layer 40. Therefore, only the structure of semiconductor device 1 in the vicinity of first gate electrode 19 in plan view of semiconductor layer 40 will be described as the representative of these structures.

Figure 7:
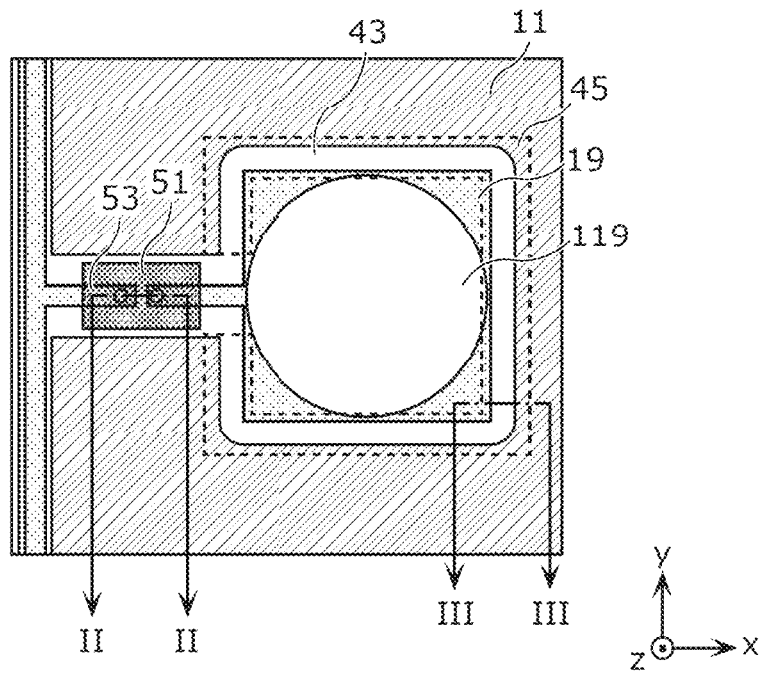
FIG. 7 is an enlarged plan view illustrating an example of the structure of the semiconductor device according to the embodiment in the vicinity of the first gate electrode according to the embodiment.
Figure 8:
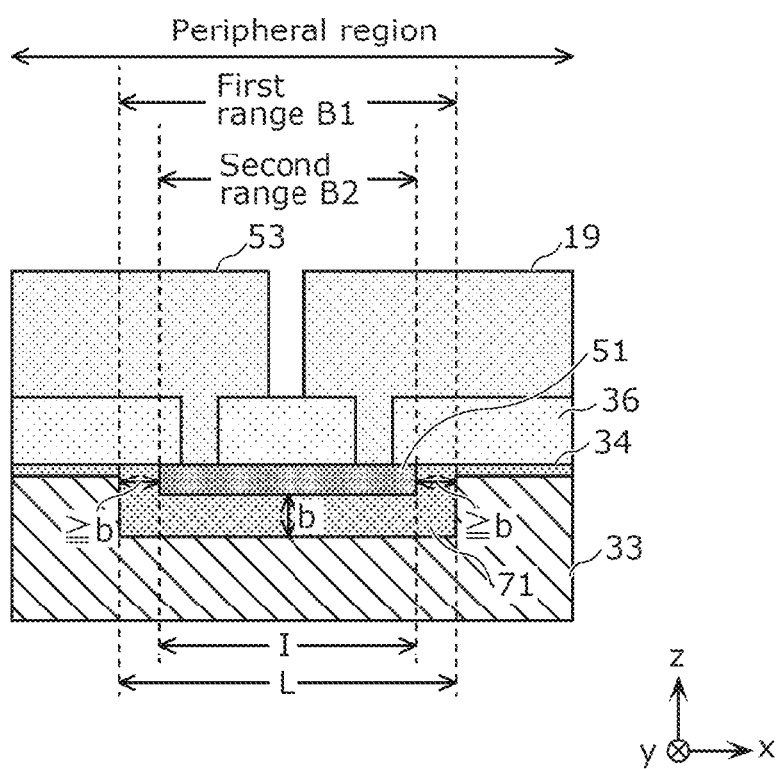
FIG. 8 is an enlarged cross-sectional view illustrating an example of the structure of the semiconductor device according to the embodiment in the vicinity of the first gate electrode according to the embodiment.
Figure 9:
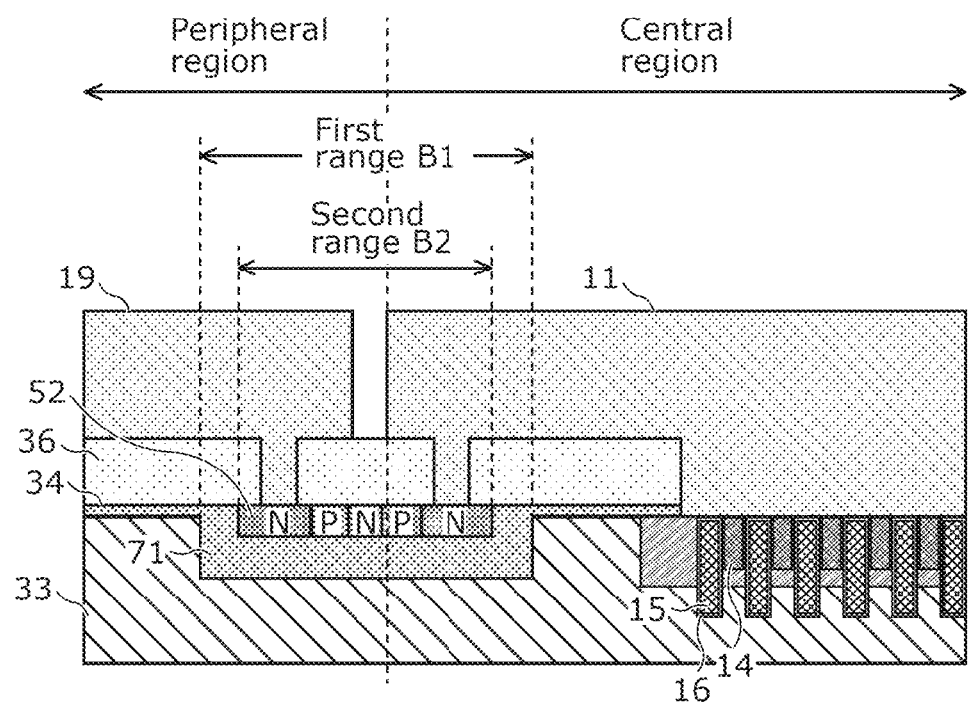
FIG. 9 is an enlarged cross-sectional view illustrating an example of the structure of the semiconductor device according to the embodiment in the vicinity of the first gate electrode according to the embodiment.

FIG. 7 is an enlarged plan view illustrating an example of the structure of semiconductor device 1 in the vicinity of first gate electrode 19 in plan view of semiconductor layer 40. FIG. 8 and FIG. 9 are enlarged cross-sectional views each illustrating an example of the structure of semiconductor device 1 in the vicinity of first gate electrode 19 in plan view of semiconductor layer 40. FIG. 8 illustrates a cross section taken at line II-II illustrated in FIG. 7, and FIG. 9 illustrates a cross section taken at line III-III illustrated in FIG. 7.

Although first source electrode 11, first gate electrode 19 excluding first gate pad 119, first gate wiring 53, first resistor element 51, and peripheral region 43 are actually not visible from the outside of semiconductor device 1, FIG. 7 illustrates first source electrode 11, first gate electrode 19 excluding first gate pad 119, first gate wiring 53, first resistor element 51, and peripheral region 43 as though they are visible.

FIG. 7 omits illustration of the constituent elements included in semiconductor device 1, other than first source electrode 11, first gate electrode 19, first gate wiring 53, first resistor element 51, and peripheral region 43.

As illustrated in FIG. 7 and FIG. 8, first resistor element 51 is connected to first gate electrode 19 and first gate wiring 53 and is made of polysilicon formed in peripheral region 43 in its entirety.

Further, as illustrated in FIG. 8, the upper surface of first resistor element 51 and the uppermost surface of surface oxide film 34 are flush with each other.

Furthermore, as illustrated in FIG. 8, first resistor element 51 is formed inside first groove 71 that is formed inside semiconductor layer 40 (low-concentration impurity layer 33) in first range B1 which at least partially includes peripheral region 43 in plan view of semiconductor layer 40.

As illustrated in FIG. 7 and FIG. 9, first Zener diode 52 is connected to first gate electrode 19 and first source electrode 11, and is made of polysilicon that is at least partially formed in peripheral region 43. As illustrated in FIG. 9, first Zener diode 52 is realized by sequentially injecting an impurity of the first conductivity type (N in FIG. 9) and an impurity of the second conductivity type (P in FIG. 9) into different regions of polysilicon.

As illustrated in FIG. 7, first Zener diode 52 is formed in first electrode facing region 45 across which first gate electrode 19 and first source electrode 11 face each other in plan view of semiconductor layer 40 and which surrounds first gate electrode 19 except for some part in plan view of semiconductor layer 40.

As illustrated in FIG. 9, the upper surface of first Zener diode 52 and the uppermost surface of surface oxide film 34 are flush with each other.

Furthermore, as illustrated in FIG. 9, first Zener diode 52 is formed inside first groove 71.

Note that the distance between: the peripheral elements, namely first resistor element 51 and first Zener diode 52; and first gate trench 17 that is located closest to a peripheral element is less than 3 µm. This reduces the factor that limits the size of first active region 12. Accordingly, the on-resistance of first vertical MOS transistor 10 can be further reduced.

In the conventional technology, since the peripheral elements are stacked on the upper surface of semiconductor layer 40, a level difference is generated between first gate trench 17 and a peripheral element, thus inevitably generating a range in which the resist thickness varies due to the level difference. In the range in which the resist thickness varies, a favorable photolithography processing precision cannot be achieved. Therefore, it was necessary to form the structure outside this range, and as a result, a distance of 3 µm or greater was required between first gate trench 17 and a peripheral element.

When: a third direction is a direction in which the distance between the peripheral elements, namely first resistor element 51 and first Zener diode 52, and first gate trench 17 which is located closest to a peripheral element is shortest; L denotes the width of first groove 71 in the third direction; b denotes the distance between the lowest position of a peripheral element and the bottom surface of first groove 71; and I denotes the width of a peripheral element in the third direction, L, b, and I satisfy I≤L−2b. Furthermore, the distance between a side wall of first groove 71 and each peripheral element is b or greater. With this, the distance between the peripheral elements and semiconductor layer 40 (low-concentration impurity layer 33) becomes b or greater in all directions. Therefore, a given insulating property between the peripheral elements and semiconductor layer 40 determined by b is ensured.

As described earlier, the upper surfaces of the peripheral elements, namely first resistor element 51 and first Zener diode 52, and the uppermost surface of surface oxide film 34 are flush with each other. That is to say, there is no level difference in the region where a resist is applied for the formation of first source regions 14 having width LS and first body regions 18 having width LB.

Therefore, it is possible to inhibit an increase in the thickness of the resist taking into account the level difference. With this, width LS of first source regions 14 formed using the resist and width LB of first body regions 18 formed using the resist can be narrower than in the conventional semiconductor device. That is, width LS of first source regions 14 can be 0.35 µm or less and width LB of first body regions 18 can be 0.30 µm or less.

Hereinafter, the structure of semiconductor device 1 in the vicinity of first gate trenches 17 will be described with reference to the drawings. Note that the structure of semiconductor device 1 in the vicinity of second gate trenches 27 is the same as the structure of semiconductor device 1 in the vicinity of first gate trenches 17. Therefore, only the structure of semiconductor device 1 in the vicinity of first gate trenches 17 will be described as the representative of these structures.

Figure 10:
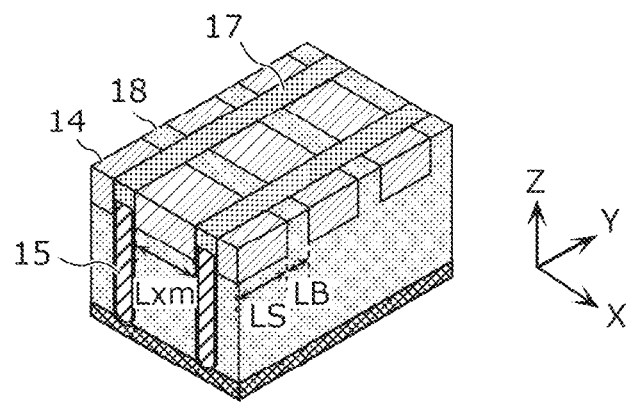
FIG. 10 is an enlarged cross-sectional perspective view illustrating an example of the structure of the semiconductor device according to the embodiment in the vicinity of first gate trenches according to the embodiment.

FIG. 10 is an enlarged cross-sectional perspective view illustrating an example of the structure of semiconductor device 1 in the vicinity of first gate trenches 17.

In FIG. 10, the Y-axis direction is the extending direction of first gate trenches 17, the Z-axis direction is the direction opposite the depth direction of first gate trenches 17, and the X-axis direction is the direction orthogonal to the Y-axis direction and the Z-axis direction and is the direction in which a plurality of first gate trenches 17 are periodically arranged in stripes.

As illustrated in FIG. 10, in semiconductor device 1, first gate conductor 15 extending in the first direction (Y-axis direction), which is the extending direction of first gate trenches 17, is formed inside each of the plurality of first gate trenches 17, and on the upper side of first body region 18 in the Z-axis direction, a plurality of first source regions 14 are periodically formed in the first direction. The plurality of first gate trenches 17 are periodically formed in stripes in the second direction orthogonal to the first direction in plan view of semiconductor layer 40.

As illustrated in FIG. 10, mesa width L×m, which is the width between first gate trenches 17, is 0.10 µm, width LS of the plurality of first source regions 14 periodically formed in the first direction is 0.35 µm or less, and the distance between the plurality of first source regions 14 periodically formed in the first direction, that is, width LB of first body region 18 in the first direction, is 0.30 µm or less. Here, mesa width L×m is less than or equal to half the width of first gate trenches 17.

Hereinafter, the structure of semiconductor device 1 in the vicinity of one ends of first gate trenches 17 will be described with reference to the drawings. Note that the structure of semiconductor device 1 in the vicinity of other ends of first gate trenches 17, the structure of semiconductor device 1 in the vicinity of one ends of second gate trenches 27, and the structure of semiconductor device 1 in the vicinity of other ends of second gate trenches 27 are the same as the structure of semiconductor device 1 in the vicinity of one ends of first gate trenches 17. Therefore, only the structure of semiconductor device 1 in the vicinity of one ends of first gate trenches 17 will be described as the representative of these structures.

Figure 11:
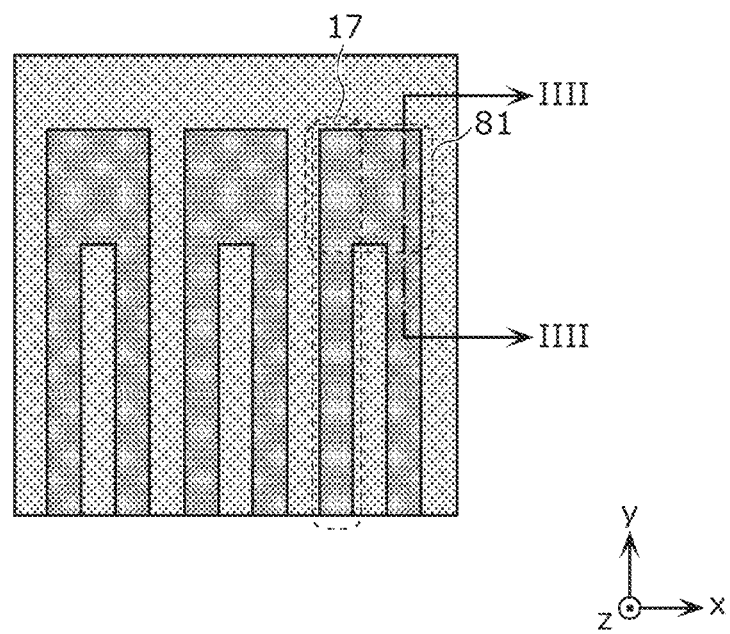
FIG. 11 is an enlarged plan view illustrating an example of the structure of the semiconductor device according to the embodiment in the vicinity of one ends of the first gate trenches according to the embodiment.
Figure 12:
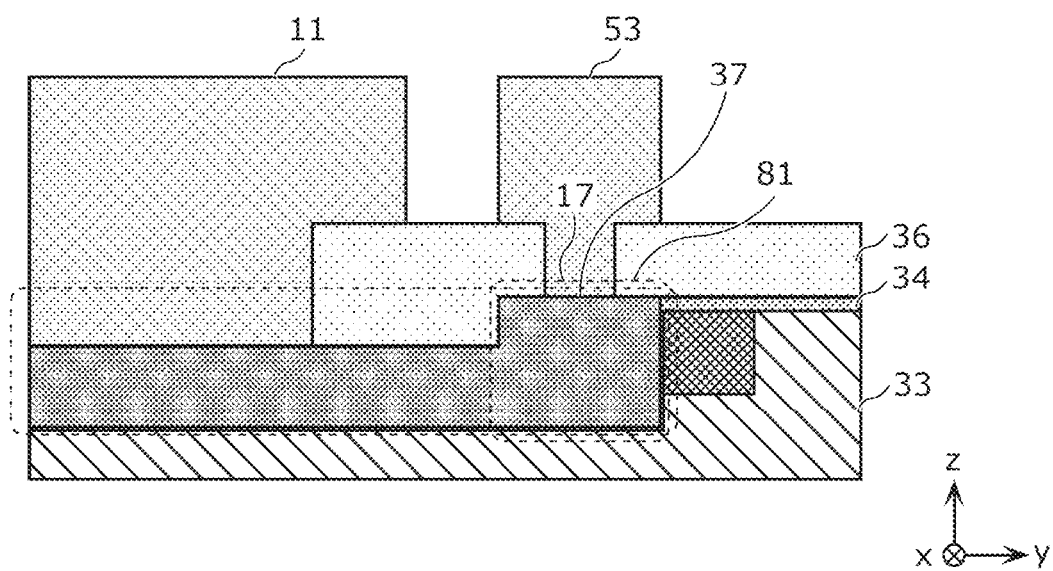
FIG. 12 is an enlarged cross-sectional view illustrating an example of the structure of the semiconductor device according to the embodiment in the vicinity of one end of a first gate trench according to the embodiment.

FIG. 11 is an enlarged plan view illustrating an example of the structure of semiconductor device 1 in the vicinity of one ends of first gate trenches 17 in plan view of semiconductor layer 40. FIG. 12 is an enlarged cross-sectional view illustrating an example of the structure of semiconductor device 1 in the vicinity of one end of first gate trench 17 in plan view of semiconductor layer 40. FIG. 12 illustrates a cross section taken at line IIII-IIII illustrated in FIG. 11.

Although the plurality of first gate trenches 17 and a plurality of connection regions 81 are actually not visible from the outside of semiconductor device 1, FIG. 11 illustrates the plurality of first gate trenches 17 and the plurality of connection regions 81 as though they are visible.

FIG. 11 omits illustration of the constituent elements included in semiconductor device 1, other than the plurality of first gate trenches 17 and the plurality of connection regions 81.

As illustrated in FIG. 11 and FIG. 12, first vertical MOS transistor 10 includes a plurality of connection regions 81 that are trenches each including, inside the trench, polysilicon connecting each of at least two (here, two) polysilicon 15 (first gate conductors 15) included inside at least two adjacent (here, two adjacent) first gate trenches 17. Here, each of the plurality of connection regions 81 extends over one ends of at least two adjacent (here, two adjacent) first gate trenches 17.

As illustrated in FIG. 12, first gate wiring 53 is connected to, at each of the plurality of contact surfaces 37, each of the polysilicon included in each of the plurality of connection regions 81.

With this, it is possible to reduce the contact resistance between first gate electrode 19 and each of polysilicon 15 included inside each of the plurality of first gate trenches 17.

Also, as illustrated in FIG. 12, each of the plurality of contact surfaces 37 is flush with the uppermost surface of surface oxide film 34.

Here, in plan view of semiconductor layer 40, each of the plurality of connection regions 81 is in a shape in which the length of the shortest line segment inside connection region 81 is less than twice the depth of connection region 81 from the upper surface of surface oxide film 34.

In the process of depositing polysilicon, polysilicon generally grows isotropically. Thus, when filling the inside of the groove with polysilicon, polysilicon grows from the bottom of the groove and the side surface of the groove at the same time. Therefore, when the groove is relatively deep and its surface area in plan view is relatively large, it is generally difficult to fill the groove with polysilicon. In semiconductor device 1, connection regions 81 may apply to this.

Meanwhile, it is generally known that the inside of a groove can be filled with polysilicon relatively easily if the groove satisfies the condition that the length of the shortest line segment inside the groove in plan view is less than twice the depth of the groove, regardless of the shape of the groove in plan view.

Connection regions 81 satisfy the above condition.

Therefore, semiconductor device 1 has a structure in which the shape of each connection region 81 is suitable for filling the inside of connection region 81 with polysilicon relatively easily.

[2. Manufacturing Method of Semiconductor Device]

Hereinafter, a manufacturing method for manufacturing semiconductor device 1 having the above configuration will be described.

In the following description of the manufacturing method for manufacturing semiconductor device 1, the manufacturing method of the constituent elements of first vertical MOS transistor 10 and the manufacturing method of the constituent elements of second vertical MOS transistor 20 are the same. Therefore, only the manufacturing method of the constituent elements of first vertical MOS transistor 10 will be described as the representative of these manufacturing methods.

Also, the manufacturing method of first Zener diode 52 and the manufacturing method of second Zener diode 62 are the same. Therefore, only the manufacturing method of first Zener diode 52 will be described as the representative of these manufacturing methods.

Also, the manufacturing methods of first Zener diode 52 and second Zener diode 62 and the manufacturing methods of first resistor element 51 and second resistor element 61 are generally the same except for the injection and non-injection of an impurity of the first conductivity type and an impurity of the second conductivity type (that is, these impurities are injected to the Zener diodes and not injected to the resistor elements). Therefore, only the manufacturing method of first Zener diode 52 will be described as the representative of these manufacturing methods.

First, as manufacturing preparation, low-concentration impurity layer 33 containing an impurity of the first conductivity type at a concentration lower than the concentration of an impurity of the first conductivity type contained in semiconductor substrate 32 is formed on the upper surface side of semiconductor substrate 32 of the first conductivity type. Low-concentration impurity layer 33 is formed by epitaxial growth, for example.

When semiconductor layer 40 is mentioned in the following description of the manufacturing method of semiconductor device 1, semiconductor layer 40 refers to low-concentration impurity layer 33 of semiconductor layer 40 unless otherwise noted.

FIG. 13 through FIG. 32 are schematic diagrams each illustrating the structure of semiconductor device 1 in the process of being manufactured. The figures illustrated in FIG. 13 through FIG. 32 are, starting with the left end figure: an enlarged schematic plan view of semiconductor device 1; an enlarged schematic cross-sectional view of semiconductor device 1 illustrating a cross section of the left end figure in an X direction; an enlarged schematic cross-sectional view of semiconductor device 1 illustrating a cross section of the left end figure in a Y1 direction; an enlarged schematic cross-sectional view of semiconductor device 1 illustrating a cross section of the left end figure in a Y2 direction; and an enlarged schematic cross-sectional view of semiconductor device 1 illustrating a cross section of the left end figure in a Y3 direction.

Figure 13:
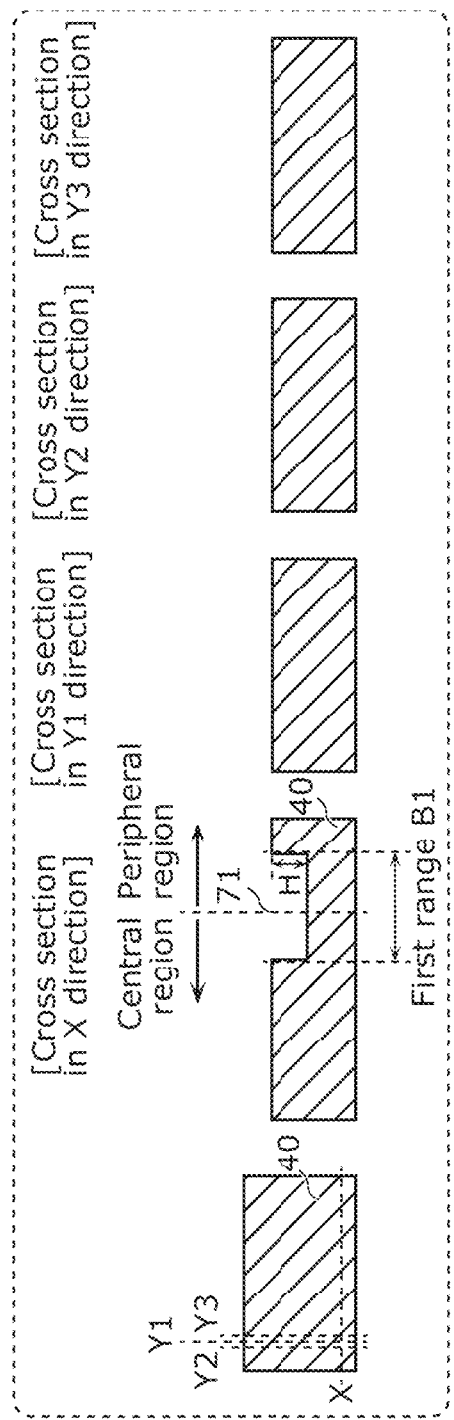
FIG. 13 is a schematic diagram illustrating the structure of the semiconductor device according to the embodiment in the process of being manufactured.

First, as illustrated in FIG. 13, first groove 71 having depth H from the upper surface of semiconductor layer 40 is formed in semiconductor layer 40 in first range B1 that at least partially includes the peripheral region in plan view of semiconductor layer 40. First groove 71 is formed by etching, for example.

Peripheral elements are to be formed inside first groove 71 in a later process. That is to say, first groove 71 is a groove for forming the peripheral elements in a later process.

With the conventional manufacturing method, first gate trenches 17 and the grooves for forming the peripheral elements are formed at the same time. Therefore, polysilicon that will be peripheral elements may become excessively thick in match with the thickness of polysilicon 15 formed in first gate trenches 17. In contrast, with the manufacturing method according to the present disclosure, first groove 71 and later-described second groove 72 for forming peripheral elements made of polysilicon are formed in processes different from the process of forming first gate trenches 17. This makes it possible to form peripheral elements made of polysilicon with an appropriate thickness, regardless of the thickness of polysilicon 15 formed in first gate trenches 17.

Also, when peripheral elements made of polysilicon are to be formed by depositing polysilicon on the upper surface side of semiconductor layer 40 rather than by filling the grooves with polysilicon, a level difference is generated on the upper surface of surface oxide film 34 in the region between first gate trenches 17 and the peripheral elements in plan view of semiconductor layer 40. Therefore, a level difference is generated in that region on a resist used for forming a structure according to first gate trenches 17 and/or a resist used for forming a structure according to the peripheral elements. The level difference causes a decrease in the photolithography processing precision in the range in which the resist thickness varies. Consequently, it was difficult to make the distance between the peripheral elements and first gate trench 17 that is located closest to a peripheral element less than 3 μm. In contrast, the manufacturing method according to the present disclosure does not generate the level difference. Therefore, with the manufacturing method according to the present disclosure, the distance between the peripheral elements and first gate trench 17 located closest to a peripheral element can be less than 3 μm.

Figure 14:
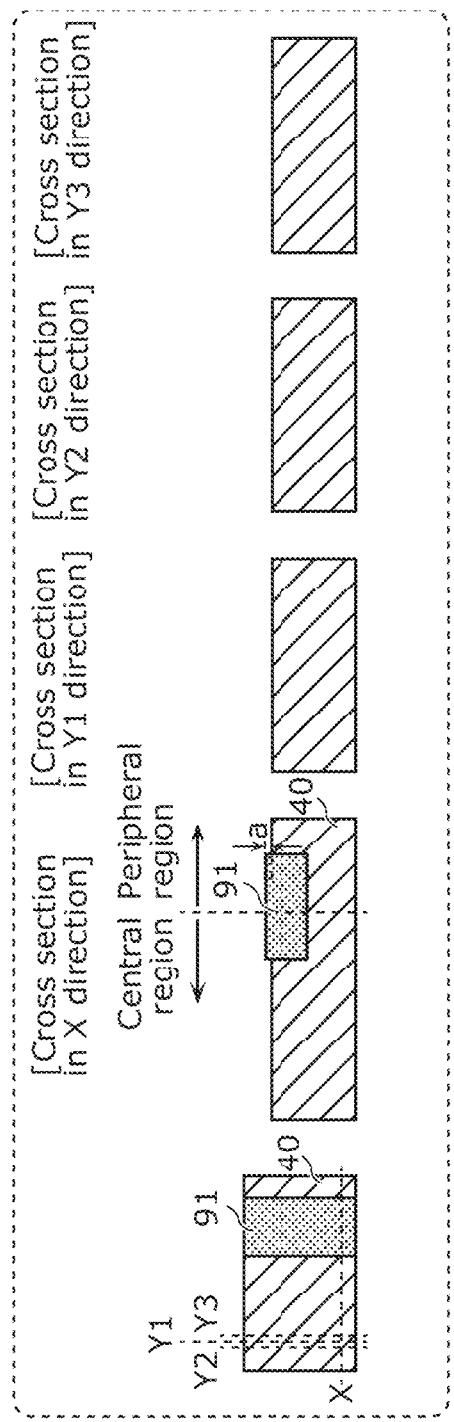
FIG. 14 is a schematic diagram illustrating the structure of the semiconductor device according to the embodiment in the process of being manufactured.

Next, as illustrated in FIG. 14, oxide film 91 is deposited up to at least the upper surface of semiconductor layer 40 to fill first groove 71. At this time, first groove 71 is filled with oxide film 91 in a manner that the upper surface of oxide film 91 protrudes from the upper surface of semiconductor layer 40 by a thickness of a. In addition, as illustrated in FIG. 15, surface oxide film 34 having a thickness a is formed on the upper surface of semiconductor layer 40 to make the upper surface of oxide film 91 and the upper surface of surface oxide film 34 flush with each other.

With the conventional manufacturing method, first gate trenches 17 and the grooves for forming the peripheral elements are formed at the same time, and the oxide film is also formed at the same time. Thus, if the oxide film is given a thickness equal to the thickness of first gate oxide films 16 in first gate trenches 17, the thickness of the oxide film is insufficient to ensure the insulating property of the peripheral elements, whereas if the oxide film is given a thickness sufficient to ensure the insulating property of the peripheral elements, the thickness of first gate oxide films 16 in first gate trenches 17 becomes excessive.

In contrast, according to the present disclosure, the formation of first gate oxide films 16 in first gate trenches 17 and the formation of the oxide film for ensuring the insulating property of the peripheral elements are separately performed, thus making it possible to set a thickness appropriate for each film.

Figure 15:
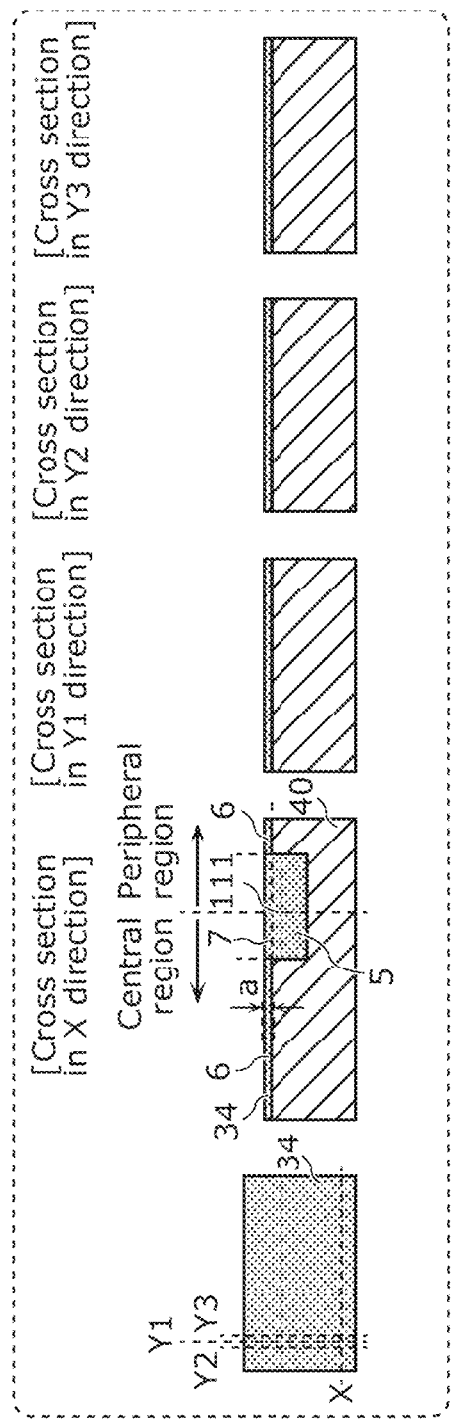
FIG. 15 is a schematic diagram illustrating the structure of the semiconductor device according to the embodiment in the process of being manufactured.

Strictly speaking, in the formation of surface oxide film 34 illustrated in FIG. 15, a slight layer of an oxide film is additionally formed on the upper surface of oxide film 91. In the process illustrated in FIG. 15, surface oxide film 34 is, for example, formed on the upper surface of semiconductor layer 40 in consideration of the additional formation that occurs only in the region of first groove 71.

Of oxide film 91 deposited to fill first groove 71, a portion deposited up to the upper surface of semiconductor layer 40 to fill first groove 71 is referred to as first oxide film 5.

A portion of oxide film 91 that protrudes from the upper surface of semiconductor layer 40 and surface oxide film 34 that is additionally formed in the process illustrated in FIG. 15 are collectively referred to as third oxide film 7.

Surface oxide film 34 formed on the upper surface of semiconductor layer 40 is referred to as second oxide film 6.

Here, for example, the process illustrated in FIG. 15 is performed to make the uppermost surface of second oxide film 6 and the uppermost surface of third oxide film 7 flush with each other.

Figure 16:
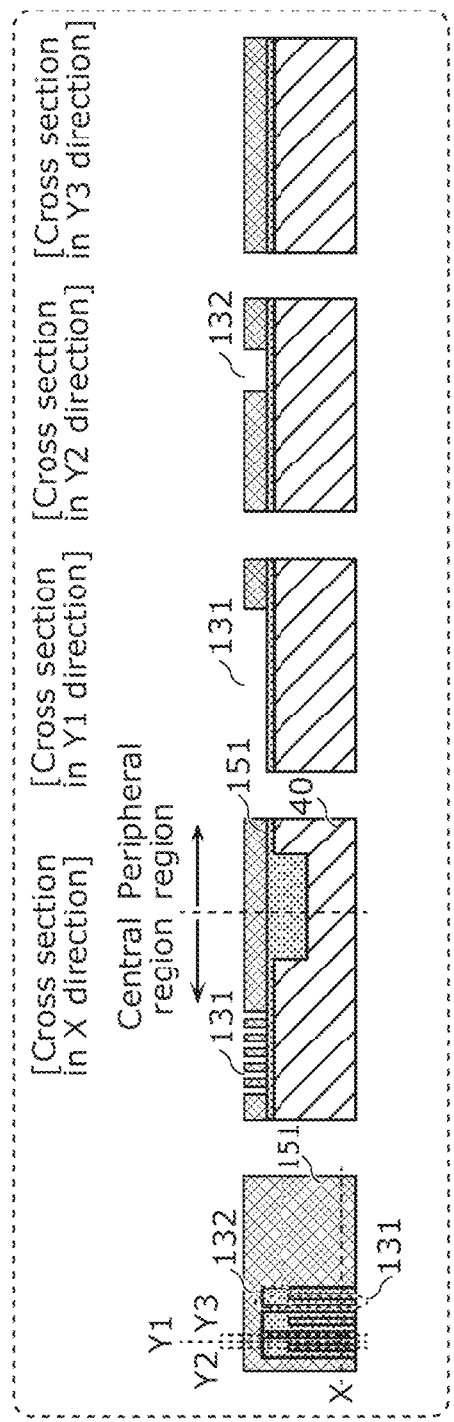
FIG. 16 is a schematic diagram illustrating the structure of the semiconductor device according to the embodiment in the process of being manufactured.

Next, as illustrated in FIG. 16, resist 151 including a plurality of openings 131 periodically formed in the second direction (X direction) is formed on the uppermost surface of second oxide film 6, resist 151 having the plurality of openings 131 defining unopened portions to have a width in the second direction less than or equal to half the width of opened portions in the second direction.

The plurality of openings 131 are openings for forming a plurality of first gate trenches 17 in a later process.

As described earlier, the uppermost surface of second oxide film 6 and the uppermost surface of third oxide film 7 form a flat surface and there is no level difference therebetween. Therefore, it is possible to inhibit an increase in the thickness of resist 151 taking into account the level difference. Accordingly, the width of unopened portions and the width of opened portions in the second direction can be narrowed while maintaining the aspect ratio of resist 151 at 3.0 or less. That is to say, mesa width L×m and first gate trenches 17 can be narrowed.

At this time, as illustrated in the left end figure in FIG. 16, resist 151 includes a plurality of connection region openings 132 each extending over ends of at least two adjacent (here, two adjacent) openings 131 in the first direction (Y1 direction, Y2 direction, Y3 direction).

The plurality of connection region openings 132 are openings for forming the plurality of connection regions 81 in a later process.

Here, the shape of the plurality of connection region openings 132 in plan view of semiconductor layer 40 satisfies the condition that the length of the shortest line segment inside connection region 81 formed using connection region opening 132 is less than twice the depth of connection region 81.

As described earlier, it is generally known that the inside of a groove can be filled with polysilicon relatively easily if the shape of the groove satisfies the above condition. The shape of connection regions 81 satisfies the above condition. It is thus possible to fill the inside of connection regions 81 with polysilicon relatively easily in a later process.

Figure 17:
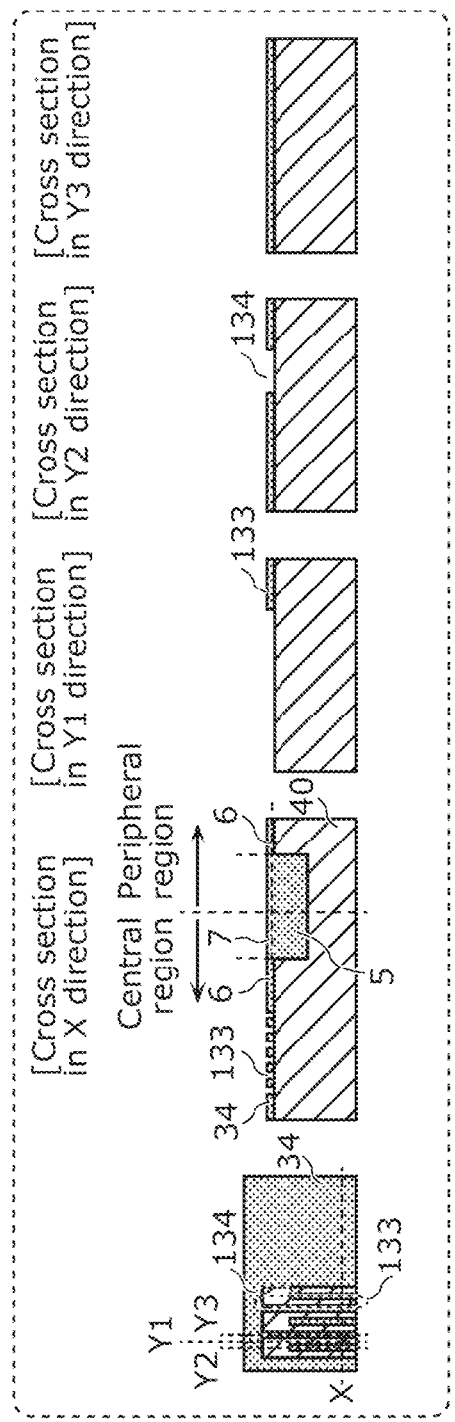
FIG. 17 is a schematic diagram illustrating the structure of the semiconductor device according to the embodiment in the process of being manufactured.

Next, as illustrated in FIG. 17, a plurality of openings 133 are periodically formed in surface oxide film 34 in the second direction (X direction) using resist 151, the plurality of openings 133 defining unopened portions to have a width in the second direction less than or equal to half the width of opened portions in the second direction.

At this time, as illustrated in the left end figure in FIG. 17, a plurality of connection region openings 134 each extending over ends of at least two adjacent (here, two adjacent) openings 133 in the first direction (Y1 direction, Y2 direction, Y3 direction) are formed using resist 151.

Figure 18:
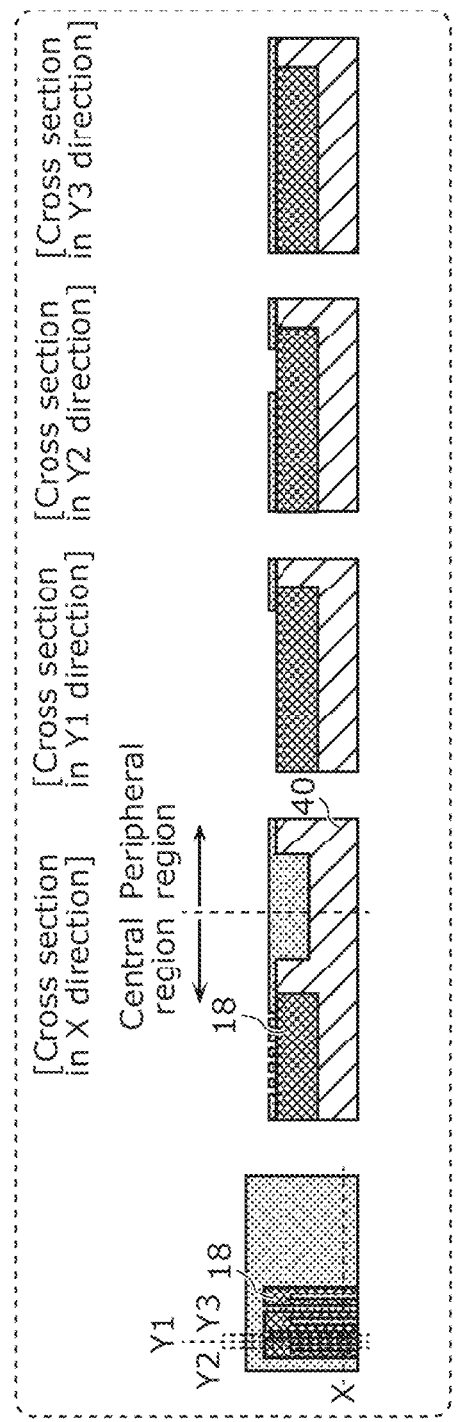
FIG. 18 is a schematic diagram illustrating the structure of the semiconductor device according to the embodiment in the process of being manufactured.

Next, as illustrated in FIG. 18, first body region 18 is formed by injecting an impurity of the second conductivity type into the upper surface side of semiconductor layer 40.

Figure 19:
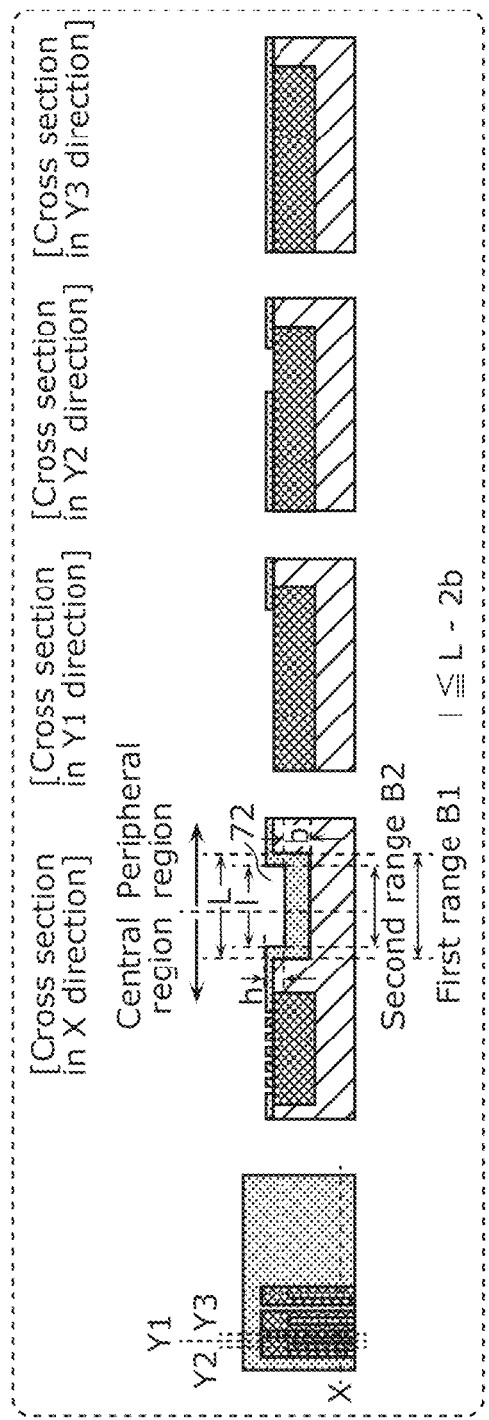
FIG. 19 is a schematic diagram illustrating the structure of the semiconductor device according to the embodiment in the process of being manufactured.

Next, as illustrated in FIG. 19, second groove 72 whose depth h from the uppermost surface of third oxide film 7 is deeper than thickness a is formed in third oxide film 7 in second range B2 that is included in first range B1 in plan view of semiconductor layer 40 and at least partially includes the peripheral region. Second groove 72 is a groove for forming the peripheral elements in a later process.

At this time, when L denotes the width of first groove 71 in the X direction, b denotes the distance from the bottom surface of second groove 72 to the bottom surface of first groove 71, and I denotes the width of second groove 72 in the X direction, second groove 72 is formed so that L, b, and I satisfy I≤L−2b and that the distance between a side wall of first groove 71 and a side wall of second groove 72 is b or greater.

With this, the distance between the peripheral elements and semiconductor layer 40 (low-concentration impurity layer 33) becomes b or greater in all directions. Therefore, a given insulating property between the peripheral elements and semiconductor layer determined by b is ensured.

Figure 20:
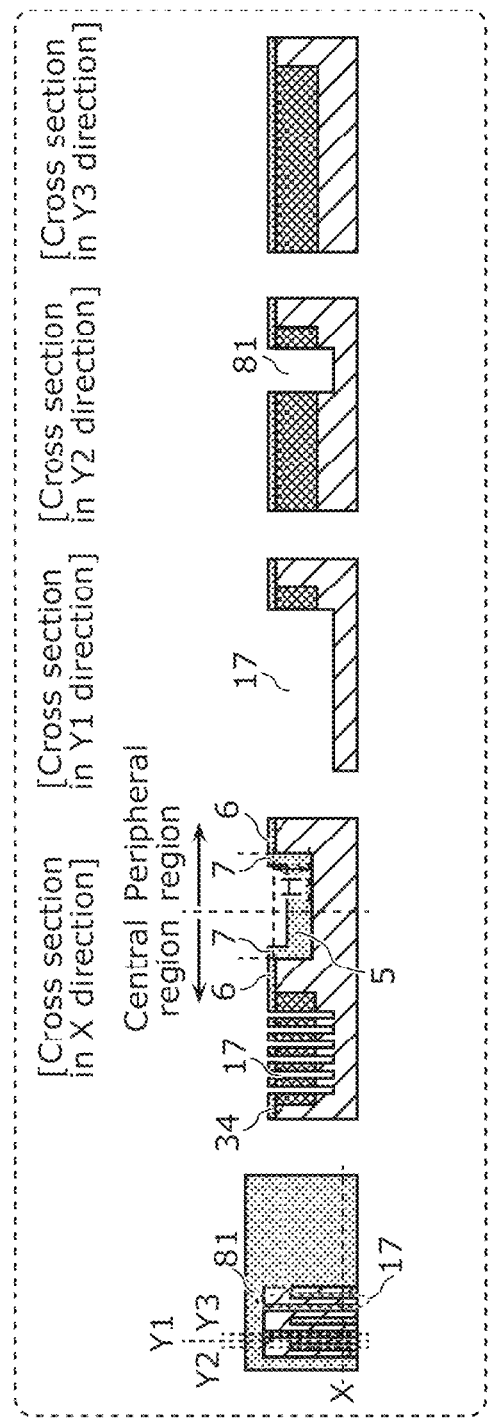
FIG. 20 is a schematic diagram illustrating the structure of the semiconductor device according to the embodiment in the process of being manufactured.

Next, as illustrated in FIG. 20, a plurality of first gate trenches 17 each having, from the uppermost surface of second oxide film 6, a depth greater than depth H are formed in semiconductor layer 40 in first central region 41. At this time, the plurality of first gate trenches 17 are formed using, as a mask pattern, second oxide film 6 having the plurality of openings 133 periodically formed. The plurality of first gate trenches 17 are formed by etching, for example.

At this time, as illustrated in the left end figure in FIG. 20, a plurality of connection regions 81 having the same depth as first gate trenches 17 and extending over ends of at least two adjacent (here, two adjacent) first gate trenches 17 in the first direction (Y1 direction, Y2 direction, Y3 direction) are formed in semiconductor layer 40 in the central region. At this time, the plurality of connection regions 81 are formed using, as a mask pattern, second oxide film 6 in which the plurality of connection region openings 134 have been formed. The plurality of connection regions 81 are formed by etching, for example.

Figure 21:
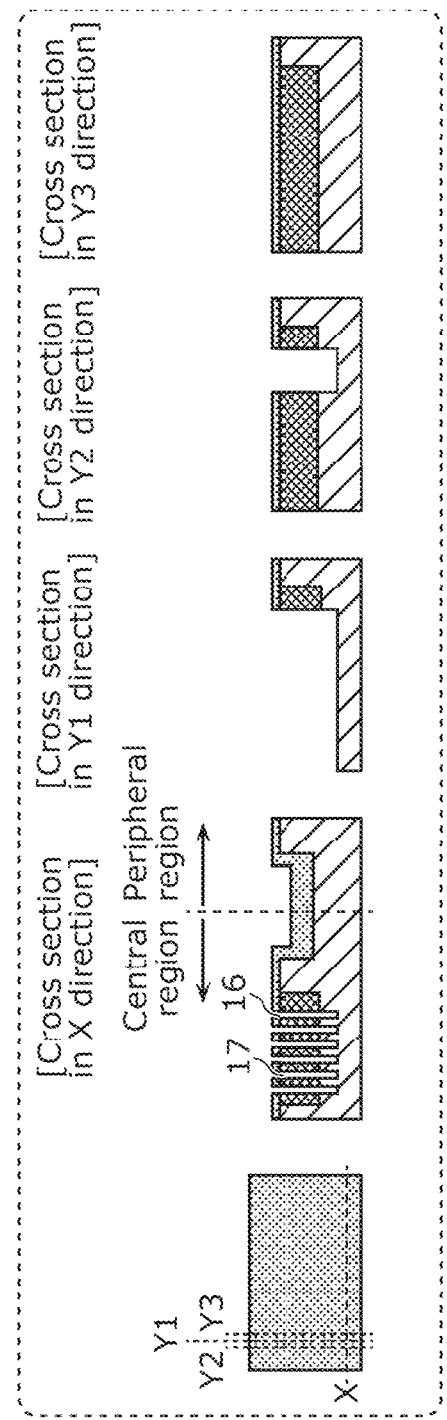
FIG. 21 is a schematic diagram illustrating the structure of the semiconductor device according to the embodiment in the process of being manufactured.

Next, as illustrated in FIG. 21, first gate oxide film 16 is formed on the entire inner surface of the plurality of first gate trenches 17 and the entire inner surface of the plurality of connection regions 81. Here, the process of forming the gate oxide film has no severe impact on thickness a of second oxide film 6 and depth h of second groove 72 since an oxide film has the property of a new oxide film being difficult to be formed additionally onto an already formed oxide film. Note that in order to avoid unnecessary complexity in the drawings, illustration of first gate oxide film 16 that has been formed is omitted in the cross section in the X direction, the cross section in the Y1 direction, the cross section in the Y2 direction, and the cross section in the Y3 direction that are illustrated in FIG. 21 and FIG. 22 through FIG. 32. In the actual device, however, first gate oxide film 16 is formed on the entire inner surfaces of the plurality of first gate trenches 17 and the entire inner surfaces of the plurality of connection regions 81 as described above.

Figure 22:
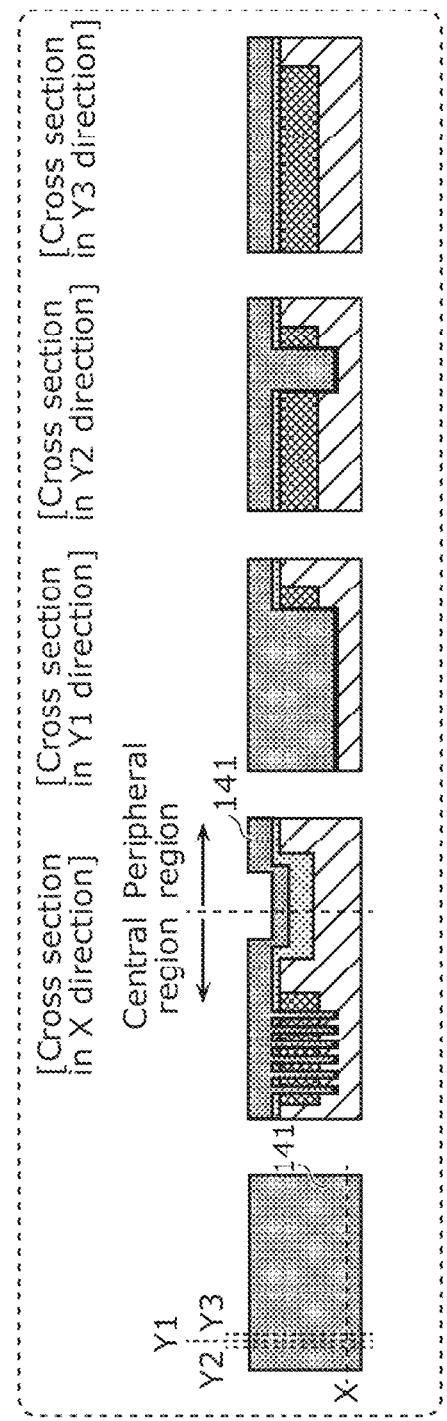
FIG. 22 is a schematic diagram illustrating the structure of the semiconductor device according to the embodiment in the process of being manufactured.

Next, as illustrated in FIG. 22, polysilicon 141 is deposited on the upper surface of semiconductor layer 40, the uppermost surface of second oxide film 6, and the uppermost surface of third oxide film 7 until at least the plurality of first gate trenches 17, second groove 72, and the plurality of connection regions 81 are filled with polysilicon.

Figure 23:
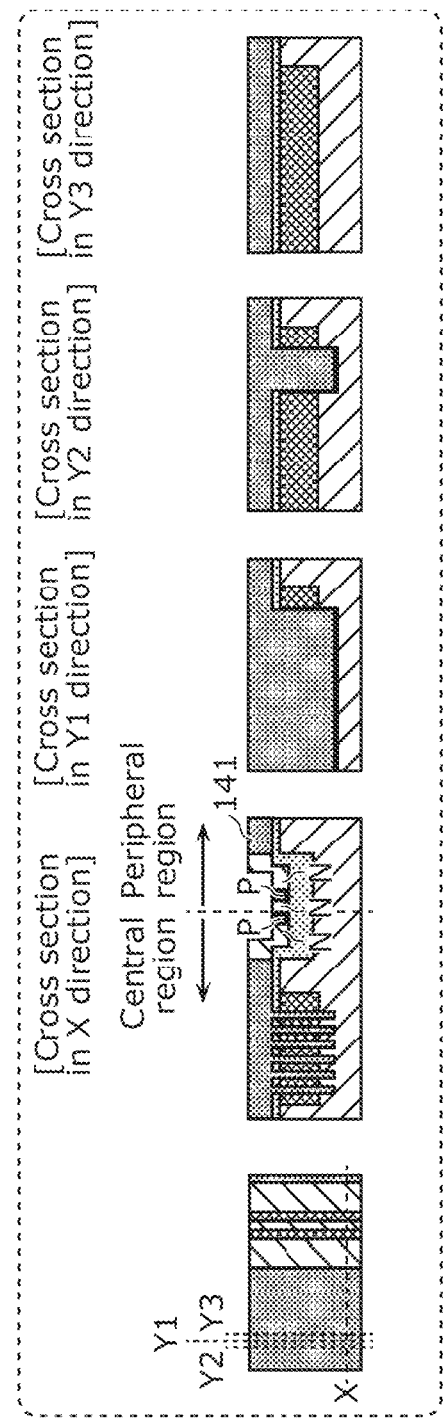
FIG. 23 is a schematic diagram illustrating the structure of the semiconductor device according to the embodiment in the process of being manufactured.

Next, as illustrated in FIG. 23, first Zener diode 52 is formed by injecting an impurity into the polysilicon with which second groove 72 has been filled. Here, both ends of second groove 72 in the X direction have a portion where the polysilicon locally becomes thicker and thus the injection of an impurity necessary for the formation of first Zener diode 52 becomes less controllable. Therefore, it is necessary to determine the dimensions of second groove 72 in advance in order for first Zener diode 52 to function as an element only by the central portion of second groove 72, excluding the both ends of second groove 72 in the X direction.

Figure 24:
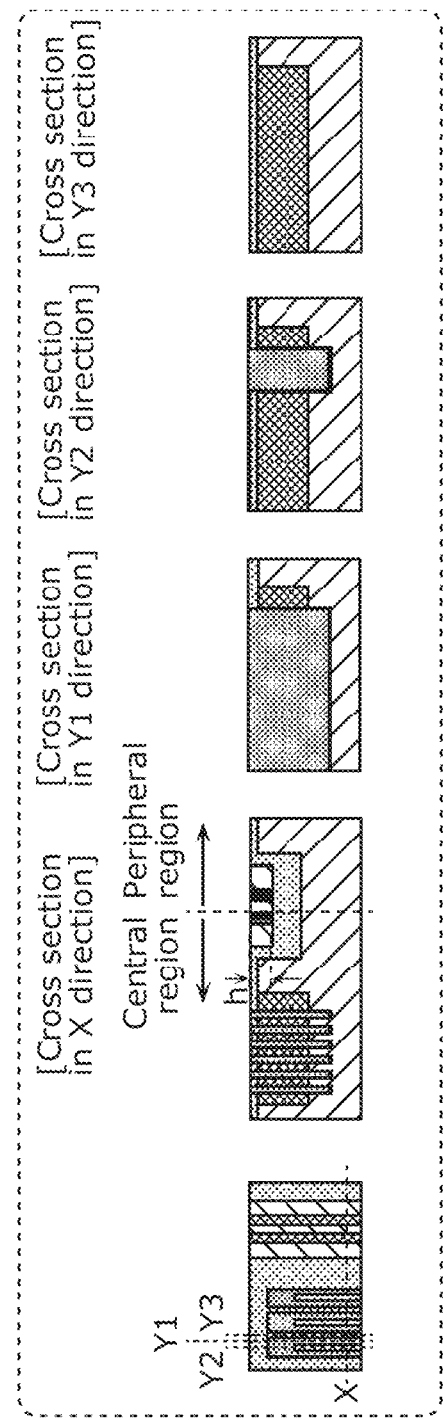
FIG. 24 is a schematic diagram illustrating the structure of the semiconductor device according to the embodiment in the process of being manufactured.

Next, as illustrated in FIG. 24, the thickness of first Zener diode 52 is made equal to h by concurrently removing the polysilicon with which the plurality of first gate trenches 17 have been filled, the polysilicon with which second groove 72 has been filled, and the polysilicon with which the plurality of connection regions 81 have been filled, until the uppermost surface of second oxide film 6, the uppermost surface of third oxide film 7, the upper surface of the polysilicon with which the plurality of first gate trenches 17 have been filled, the upper surface of the polysilicon with which second groove 72 has been filled, and the upper surface of the polysilicon with which the plurality of connection regions 81 have been filled become flush with each other.

Note that, when the present disclosure uses such expressions as: make the uppermost surface of second oxide film 6, the uppermost surface of third oxide film 7, and the upper surface of the polysilicon flush with each other; or the uppermost surface of second oxide film 6, the uppermost surface of third oxide film 7, and the upper surface of the polysilicon are flush with each other, the term "flush" does not merely refer to being precisely equal in height. In the present disclosure, in the process illustrated in FIG. 24 in which the uppermost surface of second oxide film 6, the uppermost surface of third oxide film 7, and the upper surface of the polysilicon are made flush with each other, the upper surface of the polysilicon may be slightly lower than the uppermost surface of second oxide film 6 and the uppermost surface of third oxide film 7 as a result of excessive removal of the polysilicon alone.

An advantageous effect of the present disclosure can be achieved if the level difference is small enough to avoid having a region in which the resist thickness varies. Therefore, there is no problem in having a level difference of up to, for example, 0.2 μm as a guideline, between the uppermost surface of second oxide film 6, the uppermost surface of third oxide film 7, and the upper surface of the polysilicon. Accordingly, the term "flush" encompasses this range.

In the process of concurrently removing the polysilicon with which the plurality of first gate trenches 17 have been filled, the polysilicon with which second groove 72 has been filled, and the polysilicon with which the plurality of connection regions 81 have been filled, chemical mechanical polishing may be used to concurrently remove the polysilicon with which the plurality of first gate trenches 17 have been filled, the polysilicon with which second groove 72 has been filled, and the polysilicon with which the plurality of connection regions 81 have been filled. This makes it possible to relatively easily and stably make the uppermost surface of second oxide film 6, the uppermost surface of third oxide film 7, the upper surface of the polysilicon with which the plurality of first gate trenches 17 have been filled, the upper surface of the polysilicon with which second groove 72 has been filled, and the upper surface of the polysilicon with which the plurality of connection regions 81 have been filled flush with each other.

When chemical mechanical polishing is used to remove polysilicon, such control as follows can be performed: monitor in some way how the uppermost surface of second oxide film 6 or the uppermost surface of third oxide film 7 becomes exposed, and stop polishing when the uppermost surface of second oxide film 6 or the uppermost surface of third oxide film 7 is actually exposed.

Oxide films are generally less easily polished than polysilicon, and thus, the polishing speed significantly slows down when the uppermost surface of second oxide film 6 or the uppermost surface of third oxide film 7 is exposed. Therefore, such control as follows is also effective: monitor the polishing speed and stop polishing when the polishing speed markedly slows down.

Another possible type of control is to set, with a certain margin, a time period during which polishing progresses to an excessive degree, and allow the polishing to stop automatically after the set time period elapses.

Dry etching is another possible way to concurrently remove the polysilicon with which the plurality of first gate trenches 17 have been filled, the polysilicon with which second groove 72 has been filled, and the polysilicon with which the plurality of connection regions 81 have been filled. In such a case, however, the process becomes more complicated since it is necessary to take special measures to avoid etching first Zener diode 52.

Figure 25:
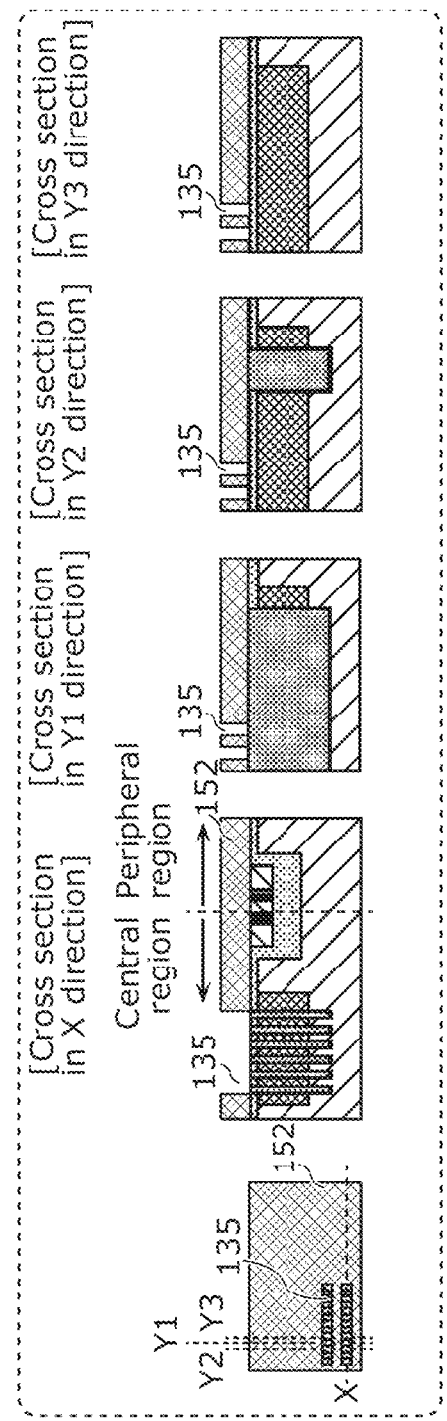
FIG. 25 is a schematic diagram illustrating the structure of the semiconductor device according to the embodiment in the process of being manufactured.

Next, as illustrated in FIG. 25, resist 152 including a plurality of first openings 135 periodically formed in the first direction (Y1 direction, Y2 direction, Y3 direction) in plan view of semiconductor layer 40 is formed on the upper surface of surface oxide film 34 and semiconductor layer 40.

At this time, the thickness of resist 152 is adjusted to less than 900 nm, for example.

As described earlier, the uppermost surface of second oxide film 6, the uppermost surface of third oxide film 7, the upper surface of the polysilicon with which the plurality of first gate trenches 17 have been filled, the upper surface of the polysilicon with which second groove 72 has been filled, and the upper surface of the polysilicon with which the plurality of connection regions 81 have been filled are at equal heights. That is to say, the upper surface of the polysilicon with which the plurality of first gate trenches 17 have been filled, the upper surface of the polysilicon with which second groove 72 has been filled, and the upper surface of the polysilicon with which the plurality of connection regions 81 have been filled form a flat surface, and there is no level difference therebetween. Therefore, it is possible to inhibit an increase in the thickness of resist 152 taking into account the level difference. Accordingly, the thickness of resist 152 can be adjusted to less than 900 nm, for example.

Also, at this time, resist 152 is formed to have a distance of 0.30 μm or less between the plurality of first openings 135 periodically formed in the first direction (Y1 direction, Y2 direction, Y3 direction), and to cause the width of the plurality of first openings 135 to be 0.35 μm or less. The plurality of first openings 135 are openings for periodically forming a plurality of first source regions 14 in the first direction (Y1 direction, Y2 direction, Y3 direction) in a later process. The distance between the plurality of first openings 135 in the first direction (Y1 direction, Y2 direction, Y3 direction) defines the distance between the plurality of first source regions 14 in the first direction (Y1 direction, Y2 direction, Y3 direction), that is, width LB of first body region 18 in the first direction. Also, the width of the plurality of first openings 135 in the first direction (Y1 direction, Y2 direction, Y3 direction) defines width LS of the plurality of first source regions 14 in the first direction (Y1 direction, Y2 direction, Y3 direction).

That is to say, width LB can be 0.30 μm or less by setting the distance between the plurality of first openings 135 in the first direction (Y1 direction, Y2 direction, Y3 direction) to 0.30 μm or less, and width LS can be 0.35 μm or less by setting the width of the plurality of first openings 135 in the first direction (Y1 direction, Y2 direction, Y3 direction) to 0.35 μm or less.

As described earlier, the uppermost surface of second oxide film 6, the uppermost surface of third oxide film 7, the upper surface of the polysilicon with which the plurality of first gate trenches 17 have been filled, the upper surface of the polysilicon with which second groove 72 has been filled, and the upper surface of the polysilicon with which the plurality of connection regions 81 have been filled are at equal heights, and therefore, the thickness of resist 152 can be adjusted to less than 900 nm. Since the thickness of resist 152 can be adjusted to less than 900 nm, the distance between the plurality of first openings 135 in the first direction (Y1 direction, Y2 direction, Y3 direction) can be 0.30 μm or less and the width of the plurality of first openings 135 can be 0.35 μm or less, while maintaining the aspect ratio at 3.0 or less. That is to say, width LB can be 0.30 μm or less, and width LS can be 0.35 μm or less.

Note that although width LS is the length of first source regions 14 in the first direction in plan view, width LS may vary in the third direction (Z direction) since first source regions 14 have a finite depth in the third direction as illustrated in FIG. 10. If width LS varies in the third direction, width LB also varies inevitably. In the present disclosure, width LS and width LB refer to width LS and width LB at any position in the third direction, and are not necessarily limited to width LS and width LB on the surface of semiconductor layer 40.

Figure 26:
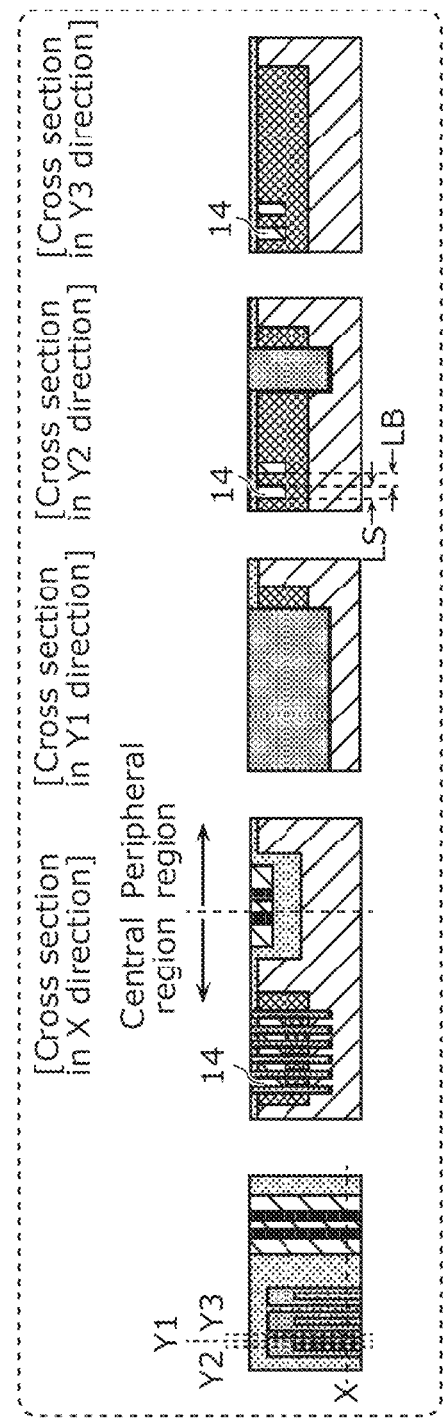
FIG. 26 is a schematic diagram illustrating the structure of the semiconductor device according to the embodiment in the process of being manufactured.

Next, as illustrated in FIG. 26, a plurality of first source regions 14 are formed by injecting an impurity of the first conductivity type into each portion of semiconductor layer 40 located in the plurality of first openings 135 in plan view of semiconductor layer 40.

Figure 27:
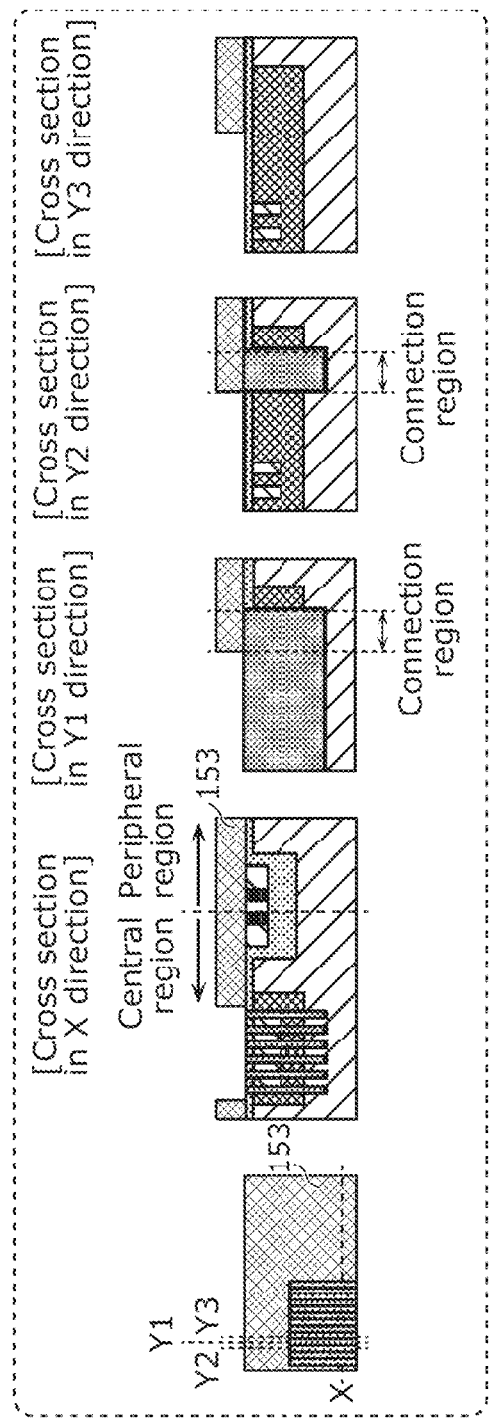
FIG. 27 is a schematic diagram illustrating the structure of the semiconductor device according to the embodiment in the process of being manufactured.
Figure 28:
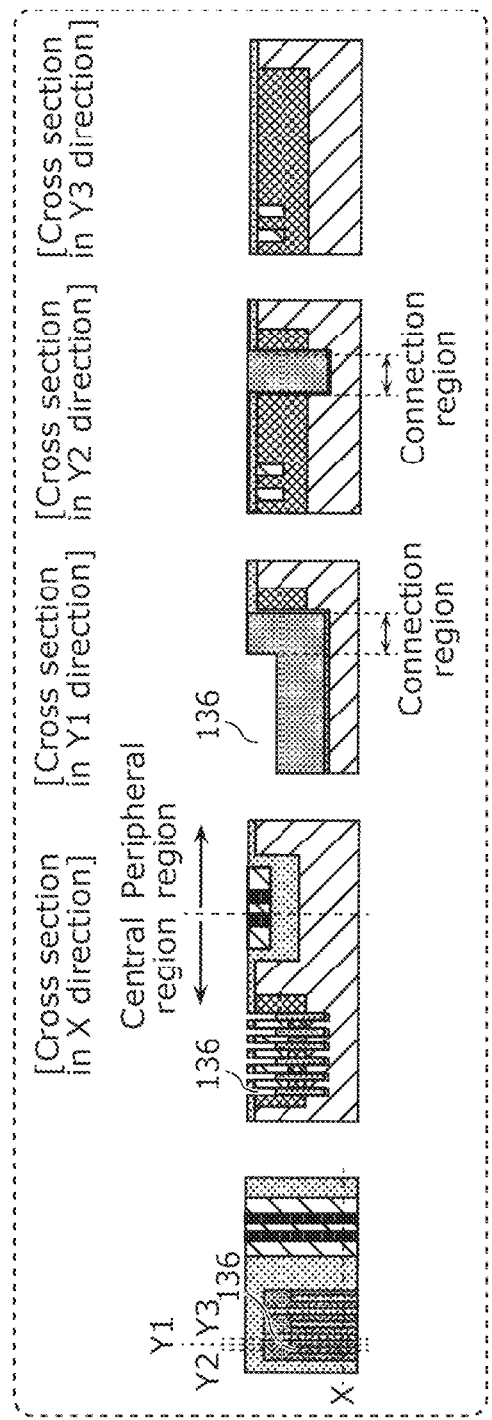
FIG. 28 is a schematic diagram illustrating the structure of the semiconductor device according to the embodiment in the process of being manufactured.

Next, as illustrated in FIG. 27, resist 153 is formed. Resist 153 includes an opening in, of the regions where the plurality of first gate trenches 17 are formed, a region excluding the regions where connection regions 81 are formed in plan view of semiconductor layer 40. As illustrated in FIG. 28, a plurality of recesses 136 corresponding one-to-one with the plurality of first gate trenches 17 are formed to expose the side wall inside each of the plurality of first gate trenches 17, by etching, using resist 153, polysilicon 15 with which each of the plurality of first gate trenches 17 has been filled.

Metal that comprises first source electrode 11 is formed inside the plurality of recesses 136 in a later process. By forming metal comprising first source electrode 11 inside the plurality of recesses 136, the contact surface area between first source electrode 11, first source regions 14, and first body region 18 can be increased as compared to the case of not forming the plurality of recesses 136. In other words, the contact resistance between first source electrode 11, first source regions 14, and first body region 18 can be reduced.

As described above, resist 153 does not include any opening in, of the regions where the plurality of first gate trenches 17 are formed, the regions where connection regions 81 are formed. As a result, the upper surface of each polysilicon inside the plurality of connection regions 81 is flush with the uppermost surface of second oxide film 6.

Figure 29:
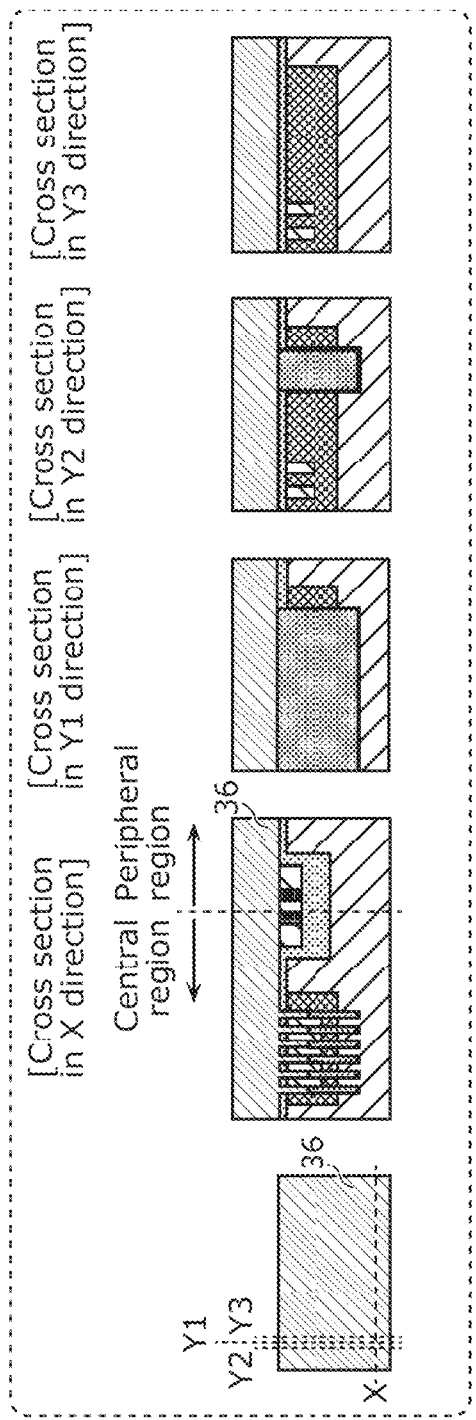
FIG. 29 is a schematic diagram illustrating the structure of the semiconductor device according to the embodiment in the process of being manufactured.
Figure 30:
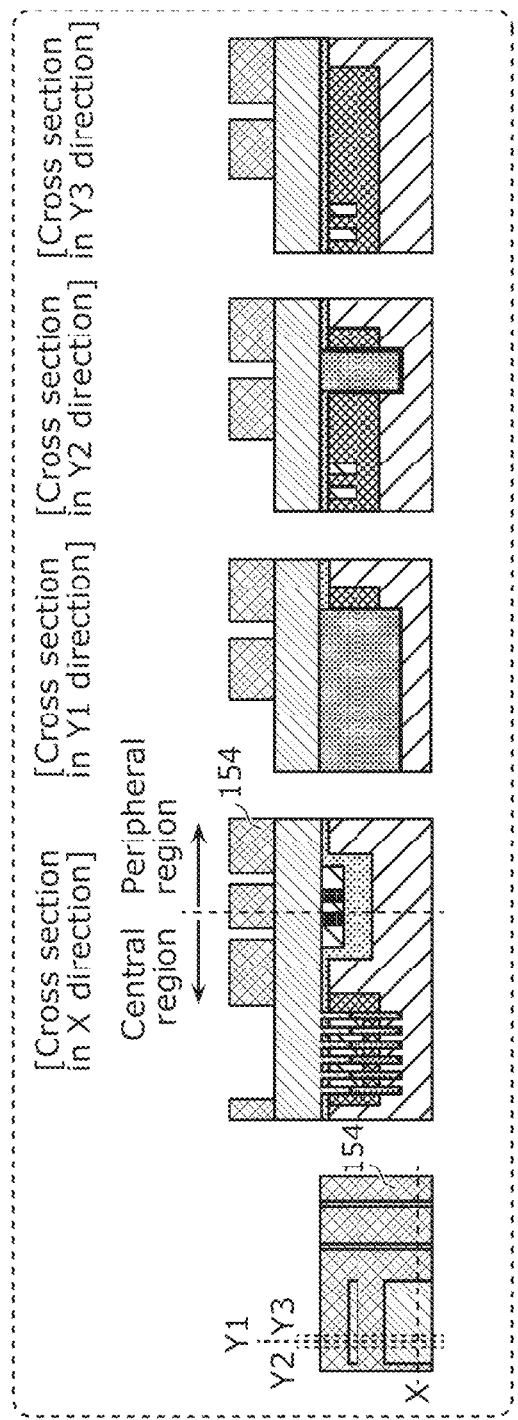
FIG. 30 is a schematic diagram illustrating the structure of the semiconductor device according to the embodiment in the process of being manufactured.
Figure 31:
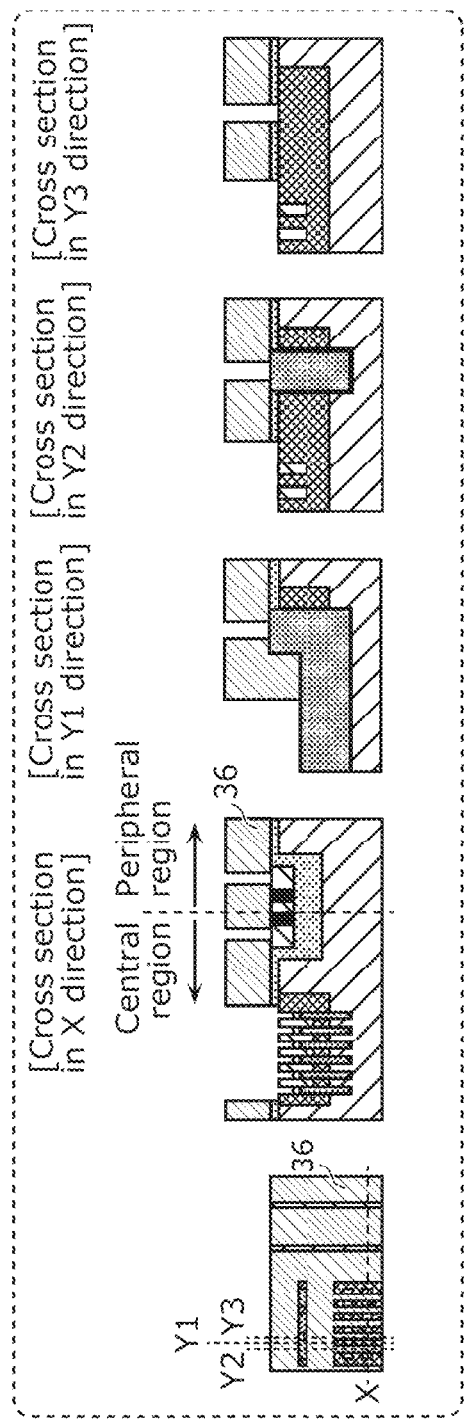
FIG. 31 is a schematic diagram illustrating the structure of the semiconductor device according to the embodiment in the process of being manufactured.
Figure 32:
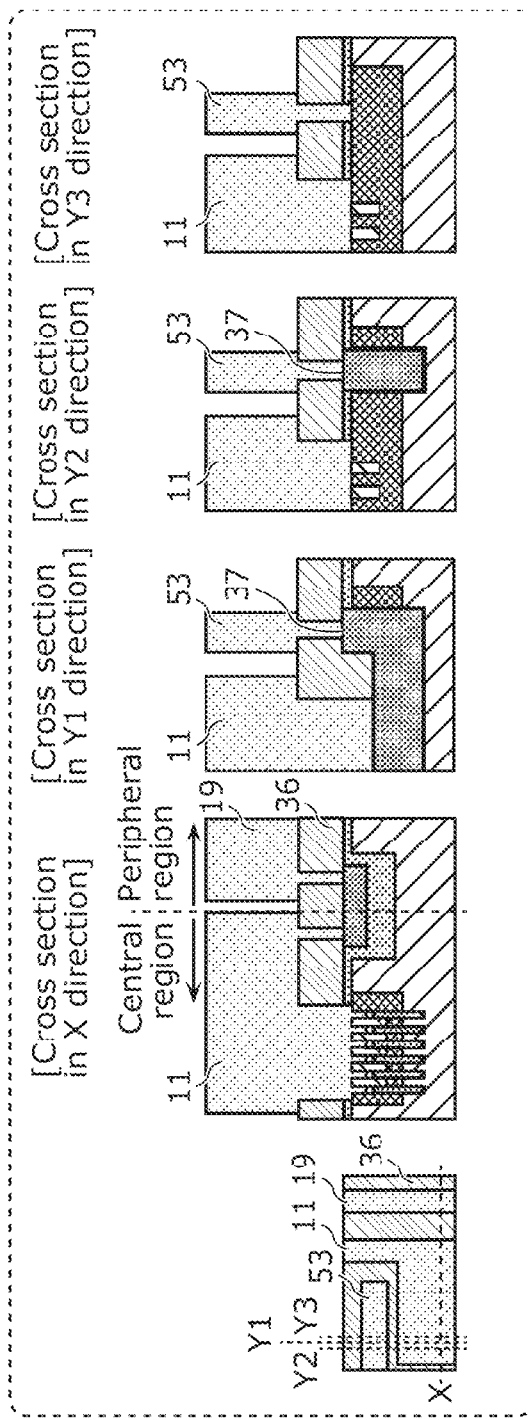
FIG. 32 is a schematic diagram illustrating the structure of the semiconductor device according to the embodiment in the process of being manufactured.

Next, as illustrated in FIG. 29, interlayer insulating film 36 that is an oxide film is formed on the entire surface in plan view of semiconductor layer 40. Subsequently, as illustrated in FIG. 30, resist 154 including openings for forming openings in interlayer insulating film 36 is formed. Then, as illustrated in FIG. 31, interlayer insulating film 36 is removed using resist 154. As illustrated in FIG. 32, formed subsequently are: first source electrode 11 that is connected to the plurality of first source regions 14, first body region 18, and one terminal of first Zener diode 52; first gate wiring 53 that is connected to the polysilicon included in the plurality of connection regions 81, that is, connected to the plurality of first gate conductors 15; and first gate electrode 19 that is connected to the other terminal of first Zener diode 52.

As described above, each of the upper surfaces of the polysilicon inside the plurality of connection regions 81 is flush with the uppermost surface of second oxide film 6. Therefore, each of contact surfaces 37 between first gate wiring 53 and the polysilicon in the plurality of connection regions 81 is flush with the uppermost surface of second oxide film 6.

Note that, in the process of performing chemical mechanical polishing to concurrently remove the polysilicon with which the plurality of first gate trenches 17 have been filled, the polysilicon with which second groove 72 has been filled, and the polysilicon with which the plurality of connection regions 81 have been filled, there is a possibility that the upper surfaces of the polysilicon become lower than the uppermost surface of second oxide film 6 in the outcome, due to a difference in polishing rate between oxide films and polysilicon. Thus, there is a possibility that each of the contact surfaces between first gate wiring 53 and the polysilicon in the plurality of connection regions 81 becomes lower than the upper surface of surface oxide film 34 within the range of the outcome of the above process.

Supplementary Notes

Although a manufacturing method and a semiconductor device according to an aspect of the present disclosure have been described based on an embodiment, the present disclosure is not limited to this embodiment. The scope of one or more aspects of the present disclosure may also encompass other forms achieved by making various modifications to this embodiment that are conceivable by a person of skill in the art as well as other forms resulting from combinations of constituent elements of different variations, so long as such forms are within the essence of the present disclosure.

INDUSTRIAL APPLICABILITY

The present disclosure is widely applicable to, for example, methods for manufacturing a semiconductor device and semiconductor devices.

The invention claimed is:

1. A manufacturing method for manufacturing a semiconductor device that is a face-down mountable, chip-size-package type semiconductor device, the semiconductor device including:
    a semiconductor layer of a first conductivity type;
    a vertical metal oxide semiconductor (MOS) transistor that is at least partially provided inside the semiconductor layer and includes, in a central region including an active region where a channel is provided, a plurality of gate trenches extending in a first direction in plan view of the semiconductor layer; and
    a peripheral element that is provided inside the semiconductor layer, is made of polysilicon, and is at least partially provided in a peripheral region adjacent to and surrounding the central region in plan view of the semiconductor layer,
    the manufacturing method comprising, in stated order:
    a first process of forming a first groove having a first depth from an upper surface of the semiconductor layer, in the semiconductor layer in a first range that at least partially includes the peripheral region in plan view of the semiconductor layer;
    a second process of depositing a first oxide film up to at least the upper surface of the semiconductor layer to fill the first groove, and concurrently forming a second oxide film of a first thickness on the upper surface of the semiconductor layer and a third oxide film on an upper surface of the first oxide film to make an uppermost surface of the second oxide film formed on the upper surface of the semiconductor layer and an uppermost surface of the third oxide film formed on the upper surface of the first oxide film flush with each other;
    a third process of forming a second groove having a second depth from the uppermost surface of the third oxide film, in the third oxide film and the first oxide film in a second range that is included in the first range and at least partially includes the peripheral region in plan view of the semiconductor layer, the second depth being greater than the first thickness, the second groove being inside the first groove in plan view of the semiconductor layer;
    a fourth process of forming the plurality of gate trenches each having a third depth from the uppermost surface of the second oxide film, in the semiconductor layer in the central region, the third depth being greater than the first depth;
    a fifth process of depositing polysilicon on an upper surface side of the semiconductor layer until at least the plurality of gate trenches and the second groove are filled with the polysilicon;
    a sixth process of forming the peripheral element by injecting an impurity into the polysilicon deposited in the second groove; and
    a seventh process of making a second thickness of the peripheral element equal to the second depth by concurrently removing the polysilicon deposited in the plurality of gate trenches and the polysilicon deposited in the second groove by chemical mechanical polishing until the uppermost surface of the second oxide film, an upper surface of the polysilicon deposited in the plurality of gate trenches, and an upper surface of the polysilicon deposited in the second groove become flush with each other.

2. The manufacturing method according to claim 1, further comprising:
    an eighth process of forming, before the fourth process starts, a body region of the vertical MOS transistor by injecting an impurity of a second conductivity type different from the first conductivity type to an upper surface side of the semiconductor layer; and
    a ninth process of forming a plurality of source regions of the vertical MOS transistor after the seventh process ends, by (i) forming, on the upper surface side of the semiconductor layer, a resist including a plurality of first openings periodically formed in the first direction in plan view of the semiconductor layer, and (ii) injecting an impurity of the first conductivity type into each portion of the semiconductor layer located in the plurality of first openings in plan view of the semiconductor layer.

3. The manufacturing method according to claim 2,
    wherein in the ninth process, the resist is formed to have a distance of 0.30 μm or less between the plurality of first openings periodically formed, and a third thickness of the resist is adjusted to 900 nm or less.

4. The manufacturing method according to claim 3,
    wherein in the fourth process, the plurality of gate trenches are formed to cause a shortest distance between the peripheral element and a gate trench among the plurality of gate trenches which is closest to the peripheral element in plan view of the semiconductor layer to be less than 3 μm.

5. The manufacturing method according to claim 3, further comprising:
    a tenth process of periodically forming, in the second oxide film, a plurality of second openings in a second direction orthogonal to the first direction in plan view of the semiconductor layer to give the second oxide film unopened portions each having a width in the second direction less than or equal to half a width of opened portions defined by the plurality of second openings, the tenth process being performed in a time period after the second process ends and before the fourth process starts,
    wherein, in the fourth process, the plurality of gate trenches are formed using, as a mask pattern, the second oxide film having the plurality of second openings periodically formed, and
    in the ninth process, the resist is formed to cause opened portions defined by the plurality of first openings formed periodically to have a width of 0.35 μm or less in the first direction.

6. The manufacturing method according to claim 5, further comprising:
an eleventh process of forming, after the ninth process ends, a plurality of recesses corresponding one-to-one with the plurality of gate trenches to expose a side wall inside each of the plurality of gate trenches, by etching each polysilicon deposited in the plurality of gate trenches.

* * * * *